United States Patent
Seo et al.

(10) Patent No.: US 10,887,980 B2
(45) Date of Patent: *Jan. 5, 2021

(54) COUPLED VIA STRUCTURE, CIRCUIT BOARD HAVING THE COUPLED VIA STRUCTURE AND METHOD OF MANUFACTURING THE CIRCUIT BOARD

(71) Applicant: Samsung Electronics Co., Ltd., Suwon-si (KR)

(72) Inventors: Dong-Yoon Seo, Seoul (KR); Jea-Eun Lee, Seoul (KR); WanSoo Nah, Suwon-si (KR)

(73) Assignees: SAMSUNG ELECTRONICS CO., LTD., Gyeonggi-do (KR); RESEARCH & BUSINESS FOUNDATION SUNKYUNKWAN UNIVERSITY, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/787,381

(22) Filed: Feb. 11, 2020

(65) Prior Publication Data

US 2020/0178386 A1 Jun. 4, 2020

Related U.S. Application Data

(63) Continuation of application No. 16/131,508, filed on Sep. 14, 2018, now Pat. No. 10,561,013.

(30) Foreign Application Priority Data

Dec. 15, 2017 (KR) .................. 10-2017-0173158

(51) Int. Cl.
*H05K 7/10* (2006.01)
*H05K 7/12* (2006.01)
(Continued)

(52) U.S. Cl.
CPC ......... *H05K 1/0251* (2013.01); *H05K 1/0245* (2013.01); *H05K 1/113* (2013.01);
(Continued)

(58) Field of Classification Search
USPC ........................................ 361/767
See application file for complete search history.

(56) References Cited

U.S. PATENT DOCUMENTS 6,388,208 B1 5/2002 Kiani et al.
6,983,433 B1 1/2006 Frank et al.
(Continued)

*Primary Examiner* — Andargie M Aychillhum
(74) *Attorney, Agent, or Firm* — Harness, Dickey and Pierce, P.L.C.

(57) ABSTRACT

A coupled via structure includes a plate via penetrating through an board body and having first and second plates spaced apart from each other by a first gap distance, a contact pad connected to the plate via on a surface of the board body and having first and second contacts connected to the first and second plates, respectively, and a connection line connected to the contact pad on the surface of the board body and having first and second lines connected to the first and second contacts, respectively, and spaced apart from the first line by a second gap distance. Accordingly, the deviation of the characteristic impedance is reduced (or, alternatively, minimized) between the coupled via structure and the coupled signal line.

20 Claims, 17 Drawing Sheets

(51) Int. Cl.
  *H05K 1/02*     (2006.01)
  *H05K 1/11*     (2006.01)
  *H05K 1/18*     (2006.01)
  *H05K 3/42*     (2006.01)
  *H05K 3/00*     (2006.01)
  *H05K 3/40*     (2006.01)

(52) U.S. Cl.
  CPC ........... H05K 1/181 (2013.01); H05K 3/0026 (2013.01); H05K 3/403 (2013.01); H05K 3/425 (2013.01); H05K 2201/09381 (2013.01); H05K 2201/09645 (2013.01); H05K 2201/09854 (2013.01); H05K 2203/107 (2013.01)

(56) References Cited

U.S. PATENT DOCUMENTS

| | | |
|---|---|---|
| 8,466,371 B2 | 6/2013 | Spory |
| 9,198,293 B2 | 11/2015 | Chase et al. |
| 9,276,549 B1 | 3/2016 | Cheng et al. |
| 9,544,992 B2 | 1/2017 | Minich |
| 9,560,741 B2 | 1/2017 | Rose et al. |
| 2006/0061432 A1 | 3/2006 | Hsu et al. |
| 2006/0081398 A1 | 4/2006 | Hsu |
| 2007/0033457 A1 | 2/2007 | Park et al. |
| 2007/0193775 A1* | 8/2007 | Chen .................. H05K 1/0222 174/262 |
| 2014/0326495 A1 | 11/2014 | Paniagua |

\* cited by examiner

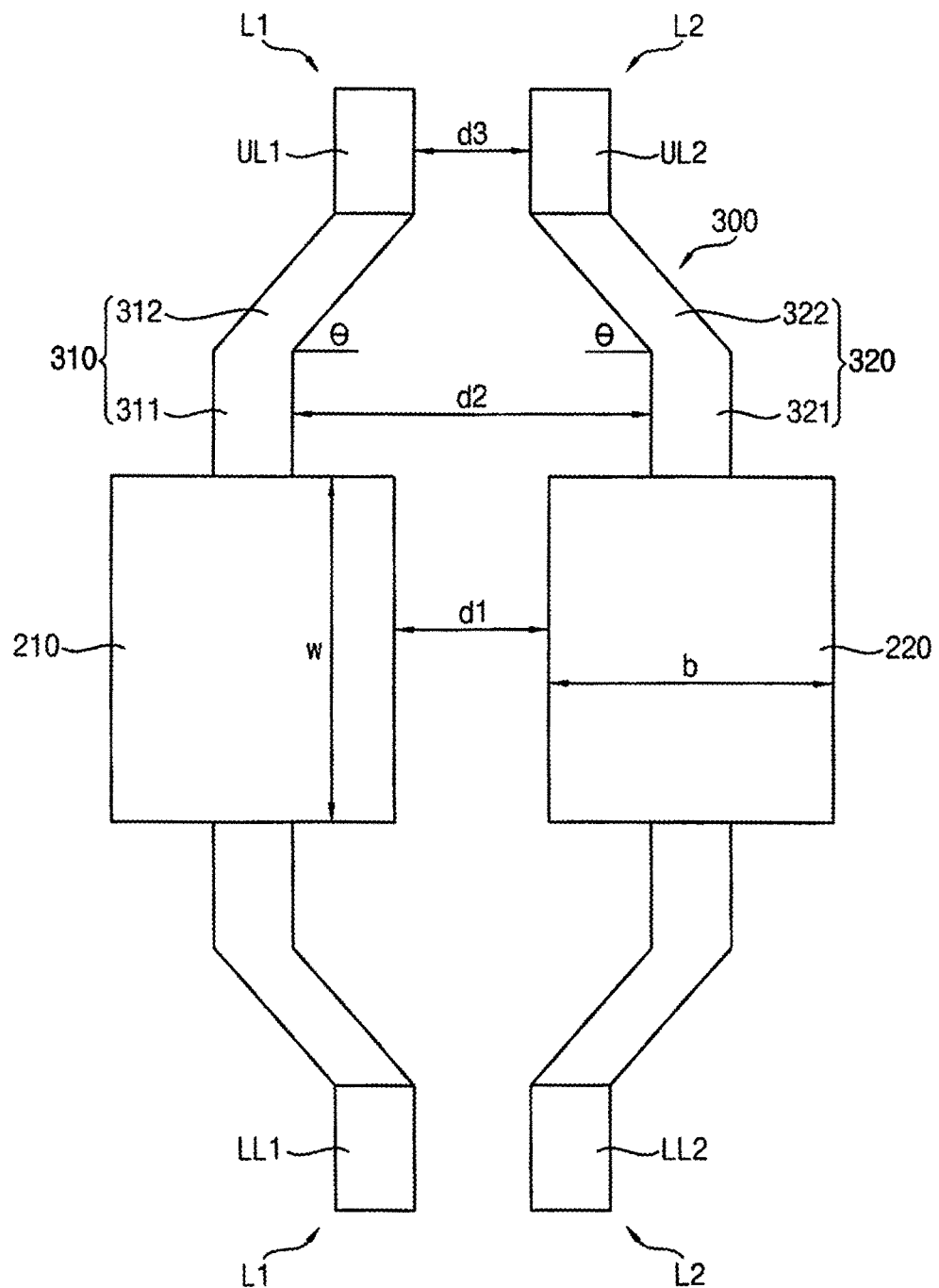

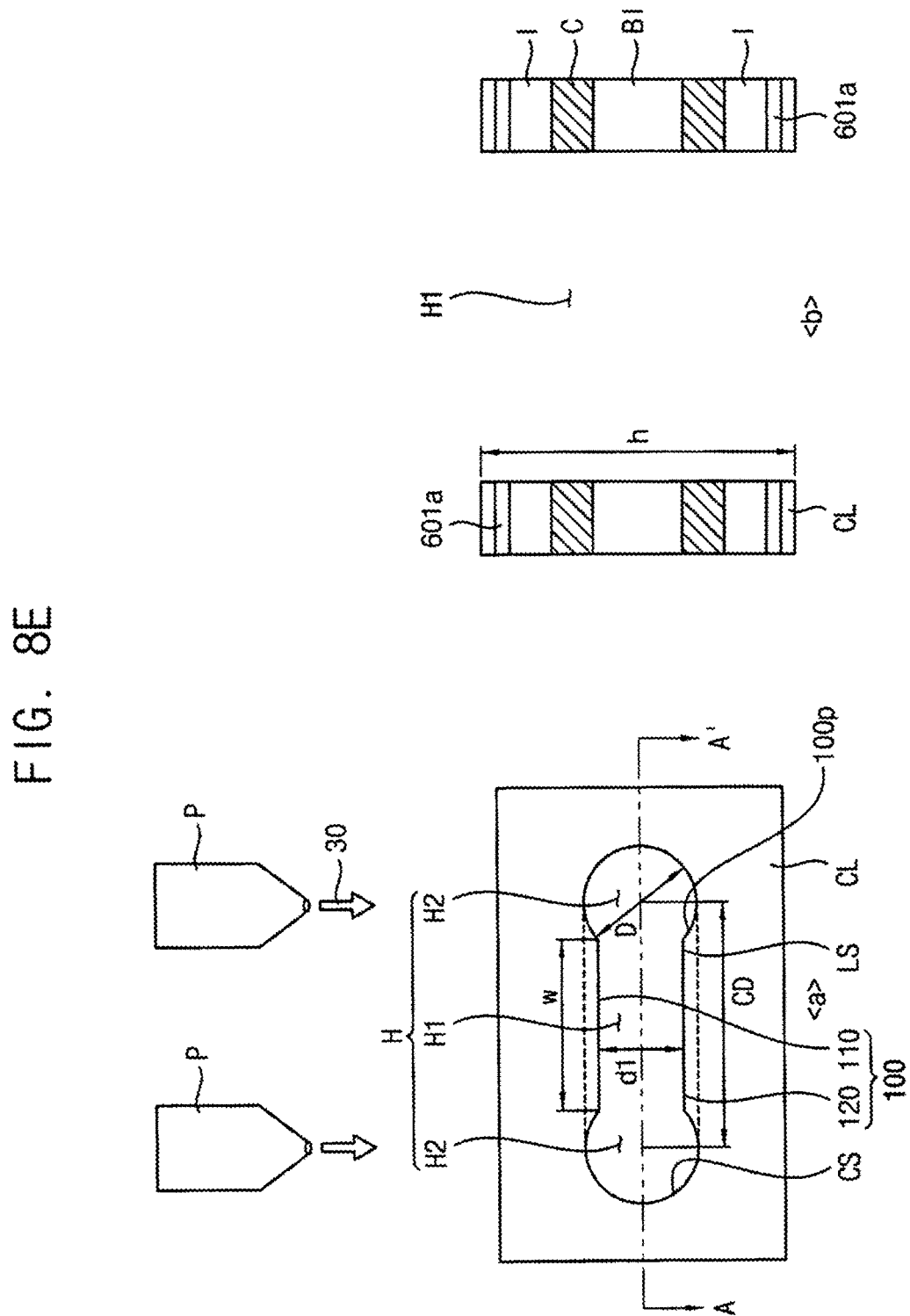

COUPLED VIA STRUCTURE, CIRCUIT BOARD HAVING THE COUPLED VIA STRUCTURE AND METHOD OF MANUFACTURING THE CIRCUIT BOARD

CROSS-REFERENCE TO RELATED APPLICATIONS

This application is a continuation of U.S. application Ser. No. 16/131,508, filed on Sep. 14, 2018, which claims priority under 35 U.S.C § 119 to Korean Patent Application No. 10-2017-0173158 filed on Dec. 15, 2017 in the Korean Intellectual Property Office, the contents of each of which are incorporated by reference herein in its entirety.

BACKGROUND

1. Field

Example embodiments relate to a coupled via structure, circuit board having the coupled via structure and/or a method of manufacturing the circuit board. For example, at least some example embodiments relate to a differential via structure vertically connecting transfer signal lines and complementary signal lines, a circuit board having the differential via structure, and/or a method of manufacturing the circuit board.

2. Description of the Related Art

A differential via structure may be used in semiconductor devices for signal integrity to meet the requirements of high integration degree and high operation speed of the recent semiconductor devices as well as excellent performance. Particularly, the semiconductor device is usually connected with various external systems via a circuit board and various transfer signals may be transferred to the circuit board between the high performance semiconductor devices and the external systems. Thus, the conventional circuit board has been configured into a multilayer structure and a via structure is usually provided with the circuit board for vertically transferring the signals between upper and lower portions of the circuit board.

A plurality of signal lines is vertically arranged and vertically separated from one another by insulation interlayers in the multilayered circuit board. Thus, the upper signal lines and the lower signal lines are electrically connected with one another by the via structure.

Particularly, some of the signal lines in the circuit board may be provided as a differential structure (hereinafter, referred to as differential signal line) for the signal integrity. For example, the differential signal line includes a line structure having a pair of a signal line for transferring a main signal and a complementary signal line for transferring a complementary signal line for transferring a complementary signal to the main signal, so that normal mode noises are removed in the circuit board by the destructive interference between the main signal and the complementary signal. The differential signal lines vertically separated are connected with each other by a via structure by which the upper and lower main signal lines and the upper and lower complementary signal lines are connected with each other, respectively, (hereinafter, referred to as differential via structure) in the circuit board.

The signal integrity is known to be damaged by discontinuities of the signal line between a signal generator and a signal receiver and the damage of the signal integrity or a signal distortion is quantitatively analyzed by a characteristic impedance of the signal. Particularly, the signal distortion of the differential signal line is usually caused mainly by the differential via structure, so the signal integrity of the differential signal line is usually determined by the characteristic impedance of the differential via structure.

A conventional differential via structure has a complicated shape or configuration and the modification of the shape parameters of the differential via structure usually causes insignificant variations to the characteristic impedance of the differential via structure. Thus, it may be difficult to adjust the characteristic impedance of the differential via structure to the characteristic impedance of the differential signal line.

SUMMARY

Example embodiments of the present inventive concepts provide a differential via structure having a pair of facing plates such that the characteristic impedance is varied by changing a gap distance and a width of the facing plates.

Other example embodiments of the present inventive concepts provide a circuit board having the above differential via structure.

Other example embodiments of the present inventive concepts provide a method of manufacturing the above circuit board.

According to example embodiments of the inventive concepts, there is provided a coupled via structure including a plate via penetrating through an board body, the plate via including a first plate and a second plate, the first plate and the second plate facing each other with a first gap distance therebetween; a contact pad connected to the plate via on a surface of the board body, the contact pad including a first contact connected to the first plate and a second contact connected to the second plate, the first contact and the second contact being separated from each other; and a connection line connected to the contact pad on the surface of the board body, the connection line including a first line and a second line, the first line connected to the first contact and the second line connected to the second contact, the second line being spaced apart from the first line by a second gap distance such that the connection line is connected to a coupled signal line having a main signal line for transferring a main signal and a complementary signal line for transferring a complementary signal with respect to the main signal.

According to example embodiments of the inventive concepts, there is provided a circuit board including an board body having an upper surface and a lower surface; a plurality of coupled signal lines arranged on the upper surface and the lower surface of the board body, respectively, each of the plurality of coupled signal lines including a main signal line and a reference signal line, the main signal line configured to transfer a main signal and the reference signal line configured to transfer a reference signal with respect to the main signal; and at least a coupled via structure including a plate via penetrating through a penetration hole between the upper surface and lower surface, the plate via including a first plate and a second plate on a pair of plane surfaces in the penetration hole such that the first plate and the second plate face each other in the penetration hole with a first gap distance therebetween, at least one of the plurality of coupled signal lines on the upper surface being connected to at least one of the plurality of coupled signal lines on the lower surface through the board body by the coupled via structure.

Other example embodiments of the present inventive concepts provide a method of a manufacturing a circuit board having the differential via structure, the method may include sequentially conducting a first penetration process and a translational process to an board body to form a first penetration hole through the board body such that a pair of plane surfaces face each other and a pair of preliminary curved surfaces face each other in the first penetration hole, the board body having a plurality of coupled signal lines on upper and lower surfaces of the board body, each of the plurality of coupled signal lines including a main signal line and a reference signal line; forming conductive layers on a side surface of the first penetration hole and on the upper and lower surfaces of the board body to such a thickness that the conductive layers on the pair of plane surfaces in the first penetration hole are spaced apart by a first gap distance; and conducting a second penetration process to the board body around the pair of preliminary curved surfaces of the first penetration hole, thereby forming a pair of second penetration holes at end portions of the first penetration hole and a plate via on the pair of plane surfaces, the plate via including first and second plates spaced apart by the first gap distance, a width of the first and second plates being smaller than an inter-center distance of the pair of second penetration holes.

According to example embodiments of the present inventive concepts, the characteristic impedance of the coupled via structure may become close to that of the coupled signal line just by changing the shape parameters of the plate via, the contact pad and the connection line. For example, the via width, the height and the first gap distance of the plate via, the length and the second gap distance of the contact pad may be changed to reduce (or, alternatively, minimize) the deviation of the characteristic impedance between the coupled via structure and the coupled signal line. The changes of the shape parameters of the coupled via structure may be automatically repeated until the deviation of the characteristic impedance between the coupled via structure and the coupled signal line may be within an allowable range. Therefore, the signal may be transferred between the upper signal line and the lower signal line via the coupled via structure without significant signal distortions.

Particularly, the coupled via structure may be configured as flat plate combinations of the plate via, the contact pad and the connection line, thereby facilitating variations of the shapes and the gap distances of coupled via structure. Thus, the parameters of the characteristic impedance of the coupled via structure may be simplified and the variation ranges of the characteristic impedance of the coupled via structure may sufficiently increase in the circuit board. Thus, the coupled via structure for reducing (or, alternatively, minimizing) the deviation of the characteristic impedance with respect to the coupled signal line may be easily formed in the circuit board.

BRIEF DESCRIPTION OF THE DRAWINGS

These and other features of example embodiments of the inventive concepts will become more apparent by describing in detail some example embodiments thereof with reference to the accompanying drawings of which:

FIG. 2B is a plan view of the coupled via structure shown in FIG. 1;

FIGS. 8A to 8F are cross sectional views illustrating process steps for the method of manufacturing the circuit board shown in FIG. 5.

DETAILED DESCRIPTION

Figure 1:
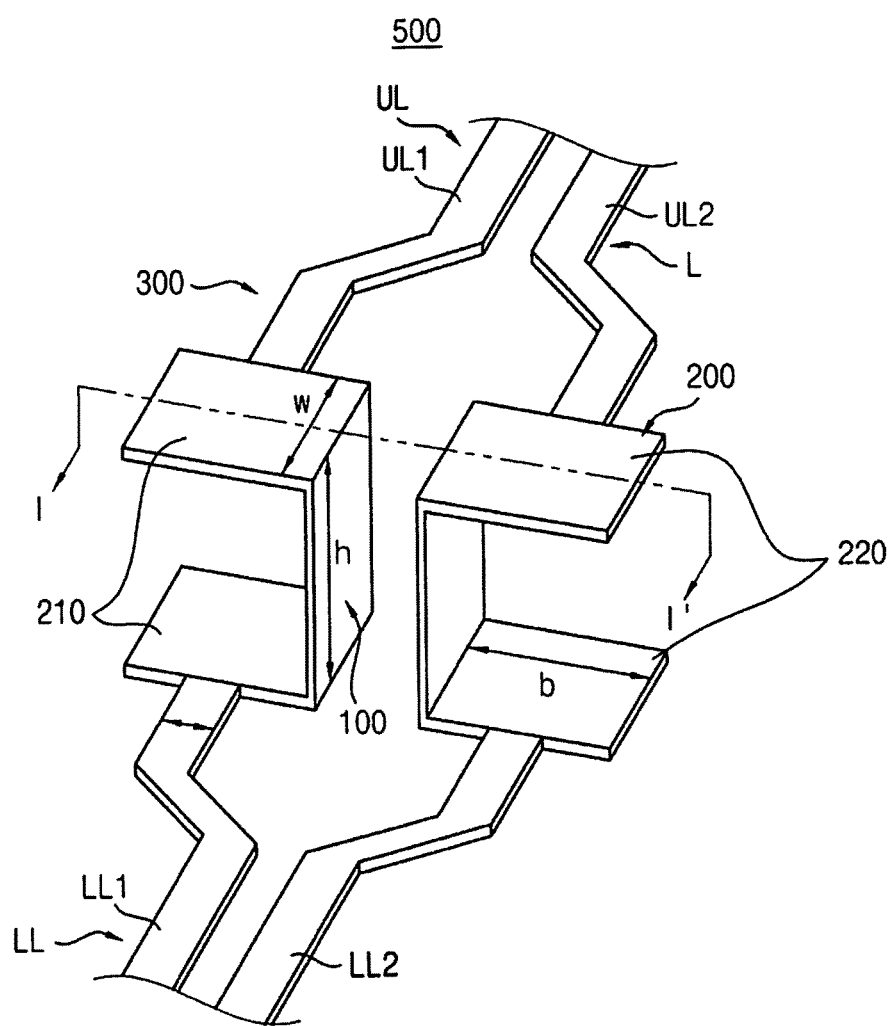
FIG. 1 is a perspective structure illustrating a coupled via structure in accordance with an example embodiment of the present inventive concepts.

Reference will now be made to example embodiments, which are illustrated in the accompanying drawings, wherein like reference numerals may refer to like components throughout.

Figure 2A:
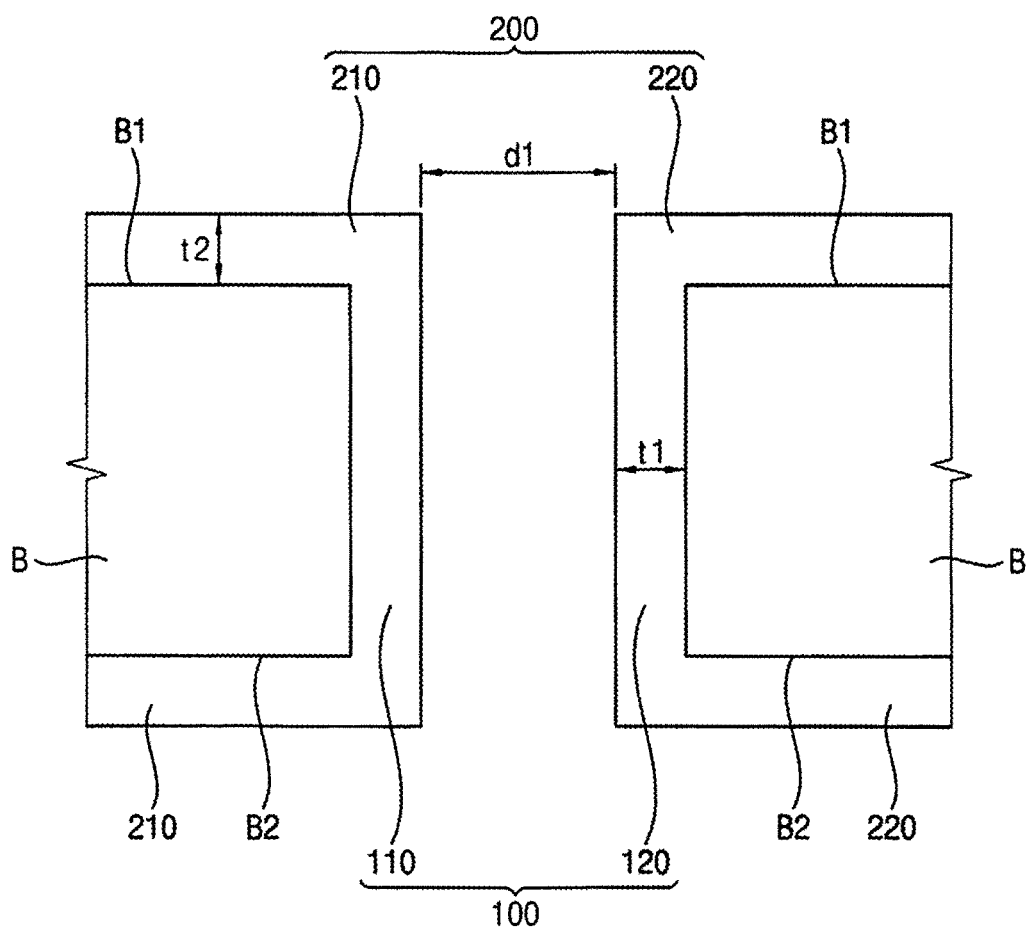
FIG. 2A is a cross-sectional view of the coupled via structure cut along a line I-I' shown in FIG. 1.

FIG. 1 is a perspective structure illustrating a coupled via structure in accordance with an example embodiment of the present inventive concepts. FIG. 2a is a cross-sectional view of the coupled via structure cut along a line I-I' shown in FIG. 1, and FIG. 2B is a plan view of the coupled via structure shown in FIG. 1.

Referring to FIGS. 1, 2A and 2B, a coupled via structure 500 in accordance with an example embodiment of the present inventive concepts may include a plate via 100 penetrating through a board body B and having a first plate 110 and a second plate 120 spaced apart by a first gap distance d1 and facing each other, a contact pad 200 connected to the plate via 100 on a surface of the board body B and having a first contact 210 connected to the first plate 110 and a second contact 220 connected to the second plate 120 such that the first contact 210 and the second contact 220 may be separated from each other, and a connection line 300 connected to the contact pad 200 on the surface of the board body B and having a first line 310 connected to the first contact 210 and a second line 320 connected to the second contact 220 and spaced apart from the first line 310 by a second gap distance d2.

Particularly, the connection line 300 may be connected to a differential signal line L having a main signal line L1 for transferring a main signal and a complementary signal line L2 for transferring a complementary signal with respect to the main signal. In the present example embodiment, the main signal line L1 and the complementary signal line L2 may be separated from each other by a third gap distance d3. The differential signal line L may include an upper differential line UL and a lower differential line LL. The upper differential signal line UL may be arranged on an upper surface B1 the board body B, and the lower differential signal line LL may be arranged on a lower surface B2 of the board body B. The upper differential signal lines UL may be connected to the lower differential signal line LL by the coupled via structure 500. In the present example embodiment, the differential signal line L is illustrated as a coupled signal line through which coupled signals are transferred via the coupled via structure 500. In such a case, the coupled via structure 500 may function as a differential via structure. However, any other pairs of signal lines through which two kinds of signals may be simultaneously transferred may also be used as the coupled signal line. The coupled signal lines may vertically connected by the coupled via structure.

In an example embodiment, the board body B may be shaped into various configurations as long as the upper and the lower surfaces B1 and B2 may be provided with the board body B and conductive lines on the upper and lower surfaces B1 and B2 may be electrically insulated from each other. Thus, the board body B may include a single insulating member and a plurality of the conductive lines such as wirings that may be stacked on the insulating member alternately with an insulation layer. That is, the board body B may include a multilayer structure in which a plurality of the wirings on the insulating member may be vertically insulated by the intervening insulation layers.

A penetration hole (not shown) may be provided with the board body B and the plate via 100 may be arranged on a sidewall of the penetration hole.

For example, the sidewall of the penetration hole may include a pair of facing plane surfaces and a pair of facing curved surfaces, and the plate via 100 may include a pair of conductive plates that are provided on the plane surfaces to a via thickness t1, respectively. The plate via 100 may penetrate through the board body B and may be connected to both of the upper and the lower differential signal lines UL and LL, so that the plate via 100 may constitute the coupled via structure 500 as a differential via structure. For example, the conductive plate of the plate via 100 may include a low-resistive conductive material such as copper (Cu).

The plate via 100 may include the first and second plates 110 and 120 that may be spaced apart from each other by the first gap distance d1 and may face each other in the penetration hole. For example, the first plate 110 may be arranged on a left plane surface and the second plate 120 may be arranged on a right plane surface in the penetration hole of the board body B.

Each of the first and the second plates 110 and 120 may be shaped into a rectangular cubic having a via width w, a height h and the via thickness t1. As will be described in detail hereinafter, the height h of the plate via 100 may correspond to a depth of the penetration hole of the board body B and the via width w of the plate via 100 may be determined by a removal degree of a conductive layer covering the sidewall of the penetration hole.

Since the plate via 100 may include the first and second plates 110 and 120 facing each other, the characteristic impedance of the coupled via structure 500 may be determined by the height h, the via width w and the first gap distance d1.

The contact pad 200 may include the first contact 210 connected to the first plate 110 and the second contact 220 connected to the second plate 120 in such a configuration that the first contact 210 and the second contact 220 may be separated from each other. The contact pad 200 may be arranged on the upper surface B1 and the lower surface B2 of the board body B. In the present example embodiment, the contact pad 200 may be integrally provided with the plate via 100 in one body. However, the contact pad 200 and the plate via 100 may be individually provided with the board body B and may be connected with each other.

Particularly, the contact pad 200 may be shaped into a rectangular plate, which may be characterized by a width correspond to the via width w and a length b, in consideration of the shape of the plate via 100. That is, the contact pad 200 may be provided as a rectangular pad having the same width as the via width w and the length b.

The first contact 210 may extend leftwards from the first plate 110 on both of the upper surface B1 and the lower surface B2 of the board body B and the second contact 220 may extend rightwards from the second plate 120 on both of the upper surface B1 and the lower surface B2 of the board body B.

Thus, the contact pad 200 may function as a landing pad for electrically connecting the plate via 100 and the differential signal line L. Particularly, the contact pad 200 may have a surface area as large as possible under the condition that the characteristic impedance of the coupled via structure 500 may not be deteriorated. In such a case, the contact stability between the plate via 100 and the differential signal line L may be sufficiently increased and the process margin for forming the coupled via structure 500 may be improved by the sufficiently large contact pad 200.

The first contact 210 may be connected to an upper main signal line UL1 on the upper surface B1 of the board body B and may be connected to a lower main signal line LL1 on the lower surface B2 of the board body B. In the same way, the second contact 220 may be connected to an upper complementary signal line UL2 on the upper surface B1 of the board body B and may be connected to a lower complementary signal line LL2 on the lower surface B2 of the board body B.

Therefore, the upper main signal line UL1 may be connected to the lower main signal line LL1 by the first contact 210 and the first plate 110, and the upper complementary signal line UL2 may be connected to the lower complementary signal line LL2 by the second contact 220 and the second plate 120.

In the present example embodiment, the contact pad 200 and the plate via 100 may be integrally provided with the integrating body B in one body and may include the same conductive materials. Thus the contact pad 200 may include low-resistive conductive material such as copper (Cu). The contact pad 200 may have a pad thickness t2 that may be identical to the via thickness t1 or may be different from the via thickness t1.

The connection line 300 may function as an intervening line for electrically connecting the differential signal line L with the contact pad 200.

For example, the connection line 300 may include a first line 310 connected to the first contact 210 and a second line 320 connected to the second contact 220 in such a configuration that the first line 310 and the second line 320 may be separated from each other by a second gap distance d2. In the present example embodiment, the second gap distance d2 may be greater than or equal to the first gap distance d1.

The third gap distance d3 may function as a shape parameter of the differential signal line L, so the characteristic impedance of the differential signal line L may be determined by the third gap distance d3. In contrast, the via width w and the first gap distance d1 of the plate via 100 and the length b of the contact pad 200 may function as shape parameters of the differential via structure 100, so the characteristic impedance of the coupled via structure 500 may be determined by the via width w and the first gap distance d1 of the plate via 100 and the length b of the contact pad 200. Thus, the third gap distance d3, the via width w, the first gap distance d1 and the length b may be set (or, alternatively, optimized) in such a way that the characteristic impedance difference between the differential signal line L and the coupled via structure 500 may be reduced (or, alternatively, minimized).

In the present example embodiment, each of the first and the second lines 310 and 320 may include a pad line 311 or 321 that may be linearly connected to the contact pad 200 and a deformable line 312 or 322 that may be flexibly connected to the differential signal line L. The configurations of the deformable line 312 or 322 may be changeable for an appropriate connection between the linear pad line 311 and the linear differential signal line L irrespective of the positions.

The configurations of the pad line 311 or 321 may be designed in such a way that the characteristic impedance difference between the differential signal line L and the coupled via structure 500 may be reduced (or, alternatively, minimized).

The characteristic impedance of the differential signal line L may be obtained by using the third gap distance d3 as the shape parameter. Then, the via width w, the height h, the first gap distance d1 and the length b may be determined in such a way that the characteristic impedance of the coupled via structure 500 may approach as much as possible to the characteristic impedance of the differential signal line L. Thus, an approximate characteristic impedance of the coupled via structure 500 may be obtained by repeated shape iterations of the plate via 100 and the contact pad 200. The configurations of the plate via 100 and the contact pad 200 may be determined based on desired (or, alternatively, optimal) values of the via width w, the height h, the first gap distance d1 and the length b for the approximate characteristic impedance of the coupled via structure 500. Then, the pad line 311 and 312 may be connected to the contact pad 200 at such contact positions that the approximate characteristic impedance of the coupled via structure 500 may be most approximate to the characteristic impedance of the differential signal line L. That is, the first and the second lines 310 and 320 may be connected to the first and the second contacts 210 and 220, respectively, at the contact positions and the characteristic impedance difference between the differential signal line L and the coupled via structure 500 may be reduced (or, alternatively, minimized). Accordingly, the second gap distance d2 may also be determined as the gap distance between the first and the second lines 310 and 320 when the characteristic impedance difference between the differential signal line L and the coupled via structure 500 may be reduced (or, alternatively, minimized).

Since the deformable line 312 or 322 may be changeable for an appropriate connection between the linear pad line 311 and the linear differential signal line L, the configurations of the deformable line 312 or 322 may be varied by the contact positions of the pad line 311 or 321.

In the present example embodiment, the deformable line 312 or 322 may include a linear conductive line that may be slanted at a slant angle θ to the differential signal line L from the pad line 311 or 321. The slant angle θ may be determined by the contact positions of the pad line 311 or 321 to the contact pad 200. Particularly, since the positions and configurations of the differential signal line L may be fixed in advance and the contact positions of the first and the second lines 310 and 320 and the second gap distance d2 between the first and the second lines 310 and 320 may be determined with respect to the fixed differential signal line L, the slant angle θ may be varied according to the second gap distance d2.

The upper main signal line UL1 may be connected to an upper portion of the first plate 110 via the first line 310 and the first contact 210 on the upper surface B1 of the insulation body B and the lower main signal line LL1 may be connected to a lower portion of the first plate 110 via the first line 310 and the first contact 210 on the lower surface B2 of the insulation body B. That is, the main signal line L1 may penetrate through the board body B in a medium of the first plate 110, the first contact 210 and the first line 310.

In the same way, the upper complementary signal line UL2 may be connected to an upper portion of the second plate 120 via the second line 320 and the second contact 220 on the upper surface B1 of the insulation body B and the lower complementary signal line LL2 may be connected to a lower portion of the second plate 120 via the second line 320 and the second contact 220 on the lower surface B2 of the insulation body B. That is, the complementary signal line L2 may penetrate through the board body B in a medium of the second plate 120, the second contact 220 and the second line 320.

According to the above-described coupled via structure 500, the via width w, the height h, the first gap distance d1, the length b, and the second gap distance d2 of the coupled via structure 500 may be determined in such a way that the characteristic impedance difference between the coupled via structure 500 and the differential signal line L may be reduced (or, alternatively, minimized), so the upper differential signal line UL may be vertically connected with the lower differential signal line LL via the coupled via structure 500 with minimal deviations of the characteristic impedance. That is, the configurations of the coupled via structure 500 for vertically connecting the differential signal lines L may be obtained in such a way that the deviations of the characteristic impedance between the coupled via structure 500 and the differential signal line L may be sufficiently reduced.

Particularly, due to the shape of the coupled via structure 500, the characteristic impedance of the coupled via structure 500 may be controlled by changing the via width w and the height of the plate via 100, the length b of the contact pad 200 and the second gap distance d2 of the connection line 300, so the deviations of the characteristic impedance between the coupled via structure 500 and the differential signal line L may be accurately and simply controlled.

In addition, the parameters of the characteristic impedance of the coupled via structure 500 may be simplified into linear parameters such as a length, a width and a height, so that the variation range of the characteristic impedance may be sufficiently expanded for the coupled via structure 500. Accordingly, the coupled via structure 500 may have the right characteristic impedance for the differential signal line L although the characteristic impedance of the differential signal line L may be varied in a wide range.

While the present example embodiments disclose the coupled via structure 500 for connecting the upper and lower differential signal lines UL and LL penetrating through the board body B, the present inventive concepts may also be applied to any other via structures for vertically connecting a pair of upper signal lines and a pair of lower signal lines.

Various modifications of the coupled via structure 500 may be allowable according to the structure of the insulation body B.

Figure 3A:
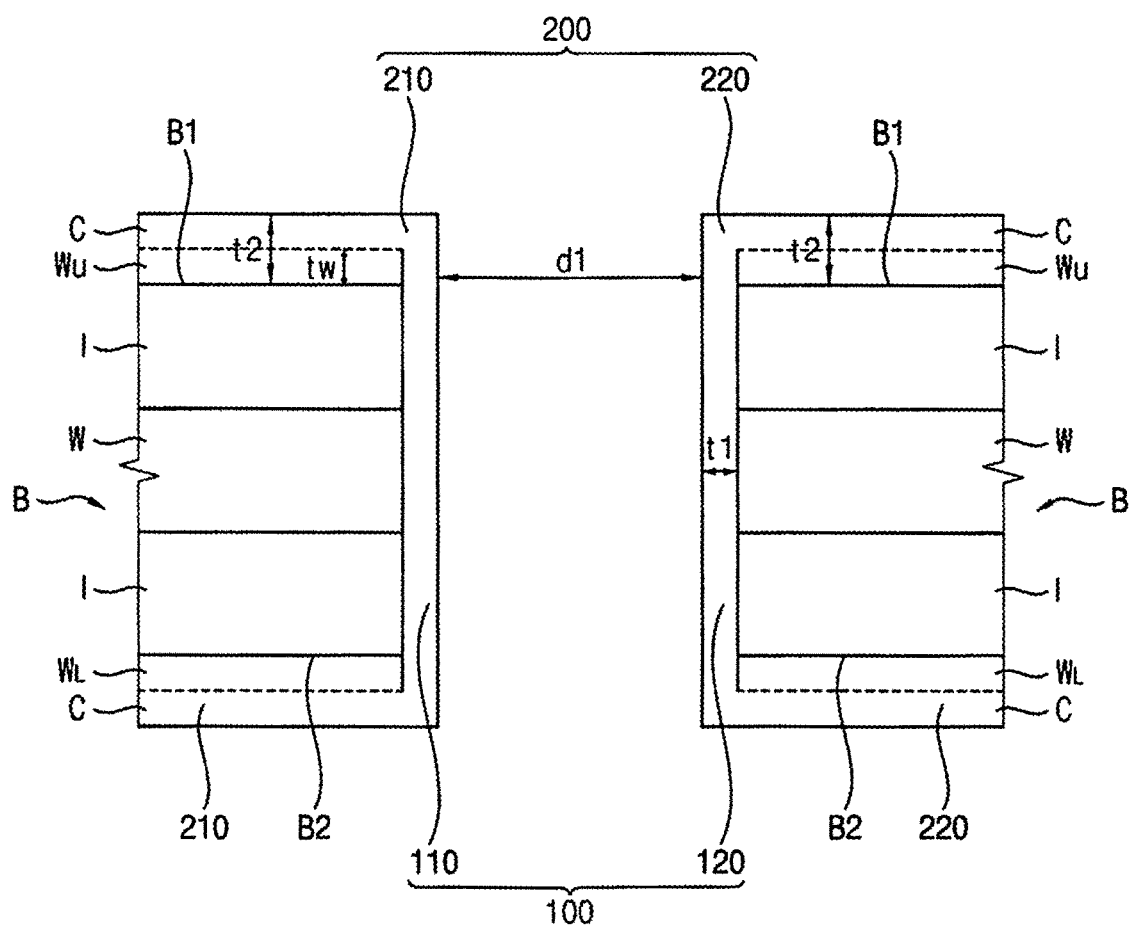
FIGS. 3A and 3B are views illustrating a first modification of the coupled via structure shown in FIG. 1.
Figure 3B:
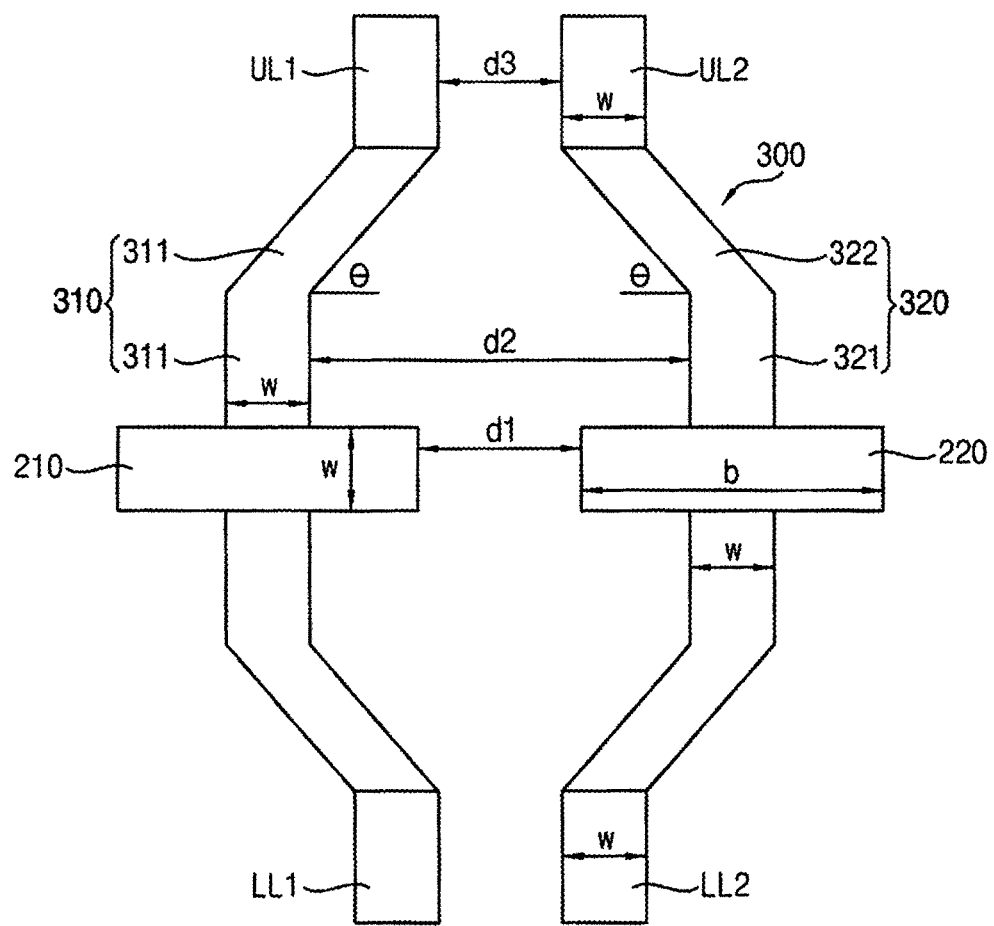

FIGS. 3A and 3B are views illustrating a first modification of the coupled via structure shown in FIG. 1. FIG. 3A is a cross-sectional view of the first modification of the coupled via structure cut along a line I-I' of FIG. 1 and FIG. 3B is a plan view of the first modification of the coupled via structure.

Referring to FIGS. 3A and 3B, the pad thickness t2 of the contact pad 200 may increase to be greater than the via thickness t1 of the plate via 100.

For example, the board body B may include a plurality of electric wirings W that may be vertically stacked alternately with an insulation layer I, and the insulation layer I may be covered by uppermost and lowermost wirings $W_U$ and $W_L$. Since a conductive layer C for forming the contact pad 200 may be formed on the uppermost and the lowermost wirings $W_U$ and $W_L$, the conductive layer C may be simultaneously patterned into the contact pad 200 together with the uppermost and the lowermost wirings $W_U$ and $W_L$. Since the uppermost and the lowermost wirings $W_U$ and $W_L$ may also include conductive materials like the conductive layer C, the uppermost and the lowermost wirings $W_U$ and $W_L$ may also function as the contact pad for electrically connecting with the connection line 300. Accordingly, the contact pad 200 may be expanded as thick as the wiring thickness $t_w$ and a resultant thickness of the conductive pad 200, i.e., the pad thickness t2, may be greater than the via thickness t1 of the plate via 100.

When the pad thickness t2 of the contact pad 200 may be greater than the via thickness t1 of the plate via 100, the connection line 300 may be controlled to have the same thickness of the contact pad 200 for reducing the shape variation between the contact pad 200 and the connection line 300.

Particularly, the contact pad 200, the connection line 300 and the differential signal line L may have the same thickness for reducing (or, alternatively, minimizing) the shape variation between the contact pad 200 and the connection line 300.

When the contact pad 200 may have the length b substantially identical to the via width w of the plate via 100 and the connection line 300 and the differential signal line L may have the same width corresponding to the length b, the shape variations may be reduced (or, alternatively, minimized) in transferring the main signals and the complementary signals and the deviation of the characteristic impedance between the differential signal line L and the coupled via structure 500 may be reduced (or, alternatively, minimized).

The impedance variation caused by the thickness difference between the contact pad 200 and the plate via 100 may be controlled by adjusting the contact positions of the connection line 300 and the contact pad 200. That is, the second gap distance d2 may be determined in such a way that the impedance variation caused by the thickness difference between the contact pad 200 and the plate via 100 may be reduced (or, alternatively, minimized).

Figure 4A:
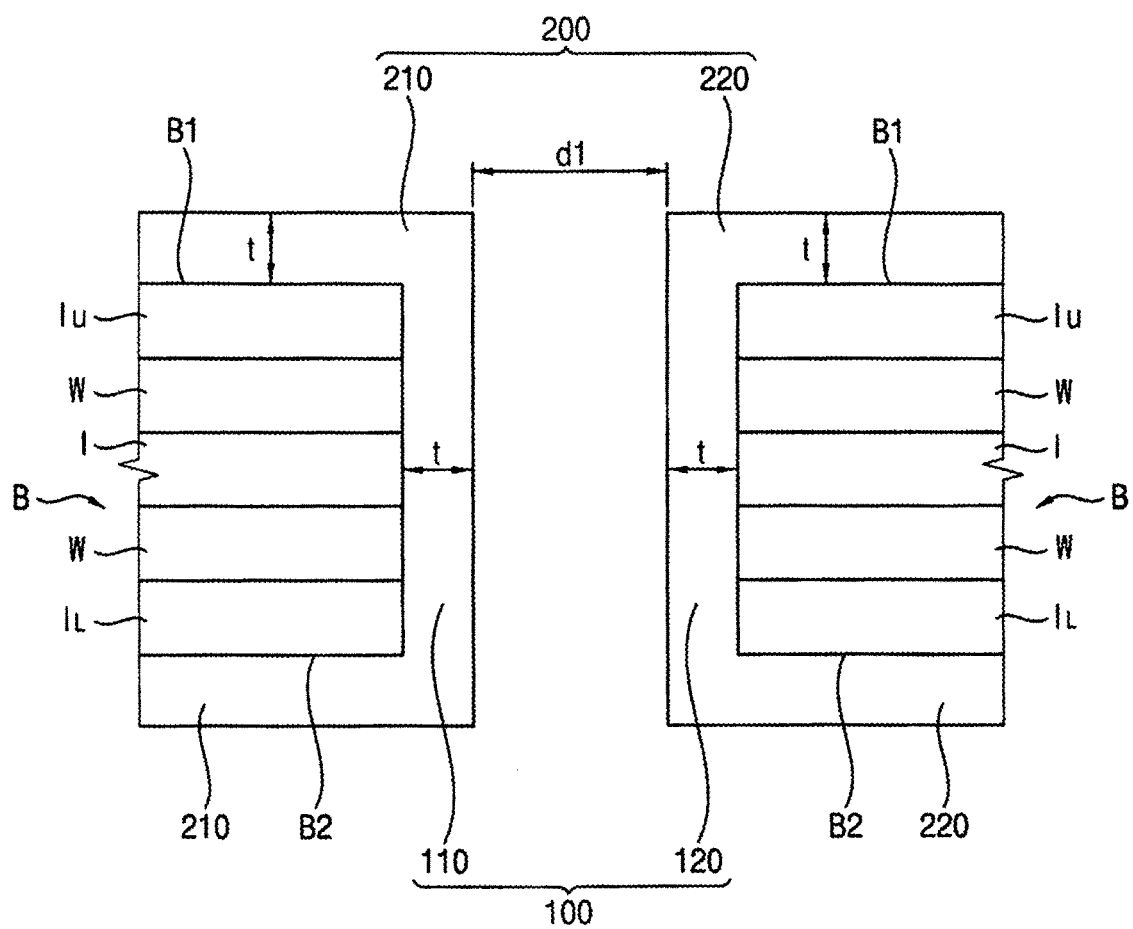
FIGS. 4A and 4B are views illustrating a second modification of the coupled via structure shown in FIG. 1.
Figure 4B:
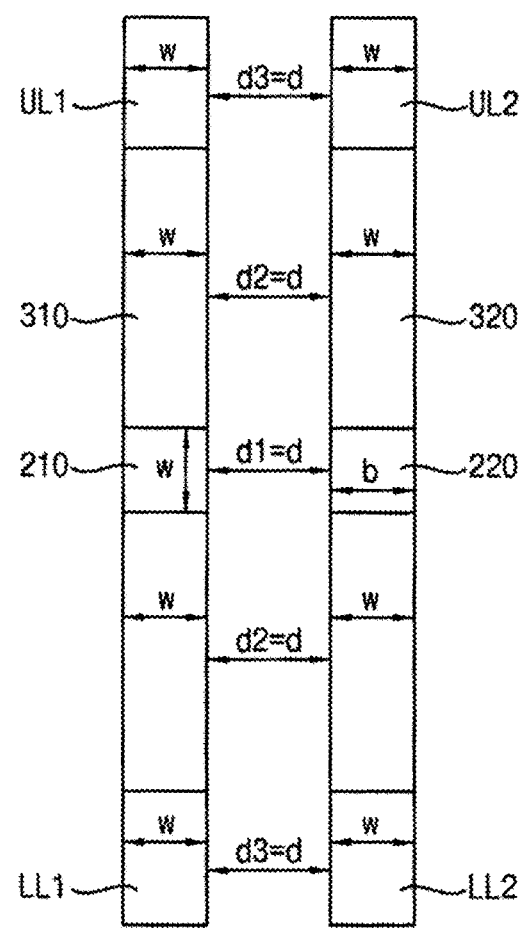

FIGS. 4A and 4B are views illustrating a second modification of the coupled via structure shown in FIG. 1. FIG. 4A is a cross-sectional view of the second modification of the coupled via structure cut along a line I-I' of FIG. 1 and FIG. 4B is a plan view of the second modification of the coupled via structure.

Referring to FIGS. 4A and 4B, the contact pad 200 may have substantially the same thickness as the plate via 100.

For example, the board body B may include a plurality of electric wirings W that may be vertically stacked alternately with an insulation layer I, and the electric wiring W may be covered by uppermost and lowermost insulation layer $I_U$ and $I_L$. Since the contact pad 200 may be arranged on the uppermost and the lowermost insulation layers $I_U$ and $I_L$ without any interposed conductive patterns, the contact pad 200 may have the same thickness as the plate via 100. That is, the plate via 100 and the contact pad 200 may have the same common thickness t.

In such a case, the connection line 300 may also have the same thickness as the contact pad 200 for reducing (or, alternatively, minimizing) the shape variation between the contact pad 200 and the connection line 300. Therefore, the plate via 100, the contact pad 200 and the connection line 300 may have the same common thickness t.

Particularly, when the thickness of the differential signal line L may be formed to have the same thickness of the contact pad 200 and the connection line 300, the deviation of the characteristic impedance between the differential signal line L and the coupled via structure 500 may be sufficiently reduced (or, alternatively, minimized).

When the contact pad 200 may have the length b substantially identical to the via width w of the plate via 100 and the connection line 300 and the differential signal line L may have the same width corresponding to the length b and the plate via 100, the contact pad 200, the connection line 300 and the differential signal line L may have the same thickness, the shape variations may be much more sufficiently reduced (or, alternatively, minimized) in transferring the main signals and the complementary signals and the deviation of the characteristic impedance between the differential signal line L and the coupled via structure 500 may be much more sufficiently reduced (or, alternatively, minimized).

In addition, when the plate via 100, the contact pad 200 and the connection line 300 may have the same thickness and width as the differential signal line L, the plate via 100, the contact pad 200, the connection line 300 and the differential signal line L may be arranged in such a way that the first gap distance d1, the second gap distance d2 and the third gap distance d3 may be the same as the differential gap distance d. That is, the coupled via structure 500 and the differential signal line L may be have the same differential gap distance d and the shape variation between the differential signal line L and the coupled via structure 500 may be ultimately reduced (or, alternatively, minimized). Accordingly, the deviation of the characteristic impedance between the coupled via structure 500 and the differential signal line L may be ultimately reduced and the signal may be transferred between the upper differential signal line UL and the lower differential signal line LL without signal distortions.

Figure 5:
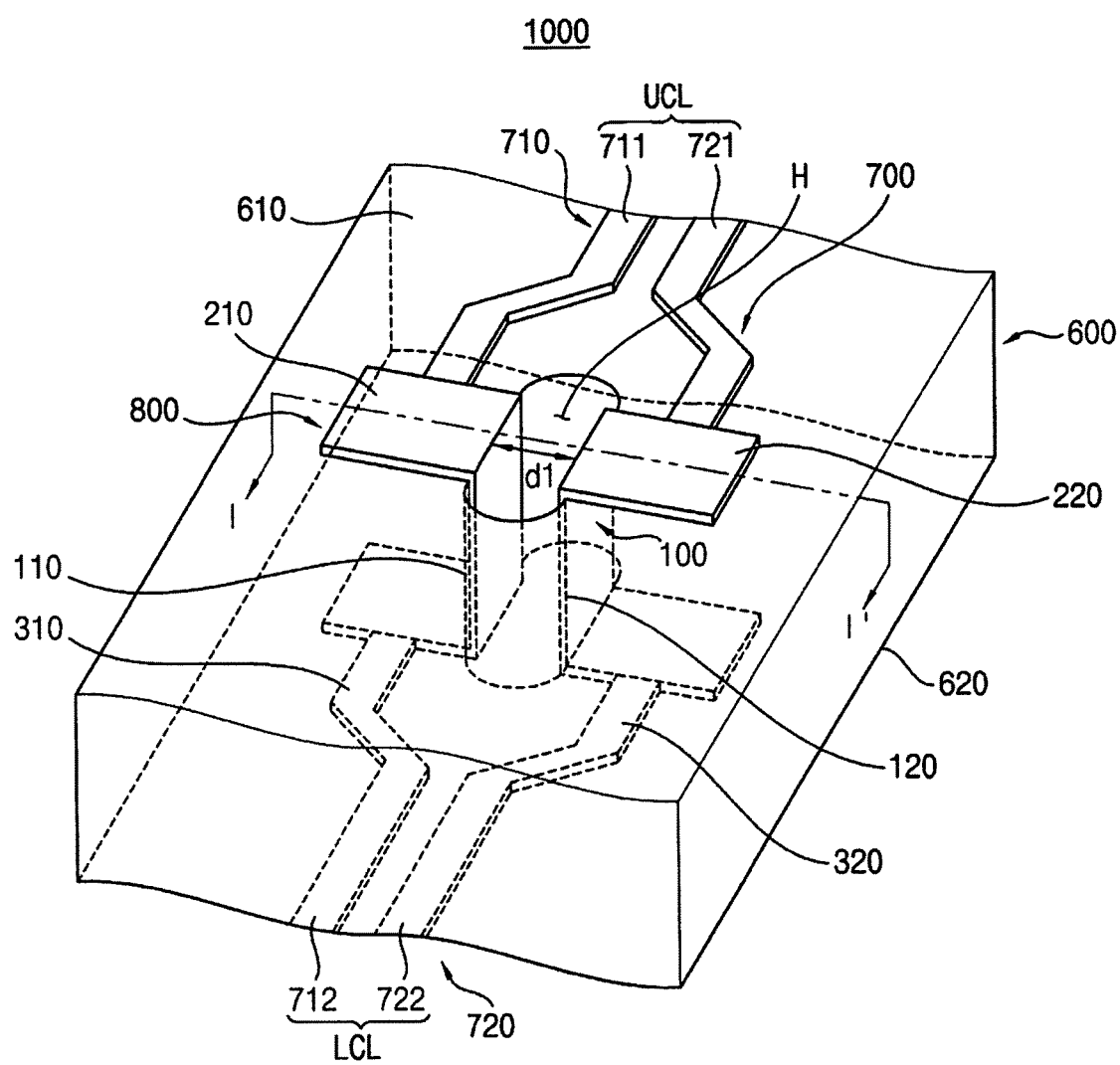
FIG. 5 is a perspective view illustrating a circuit board including the coupled via structure shown in FIG. 1 in accordance with an example embodiment of the present inventive concepts.
Figure 6A:
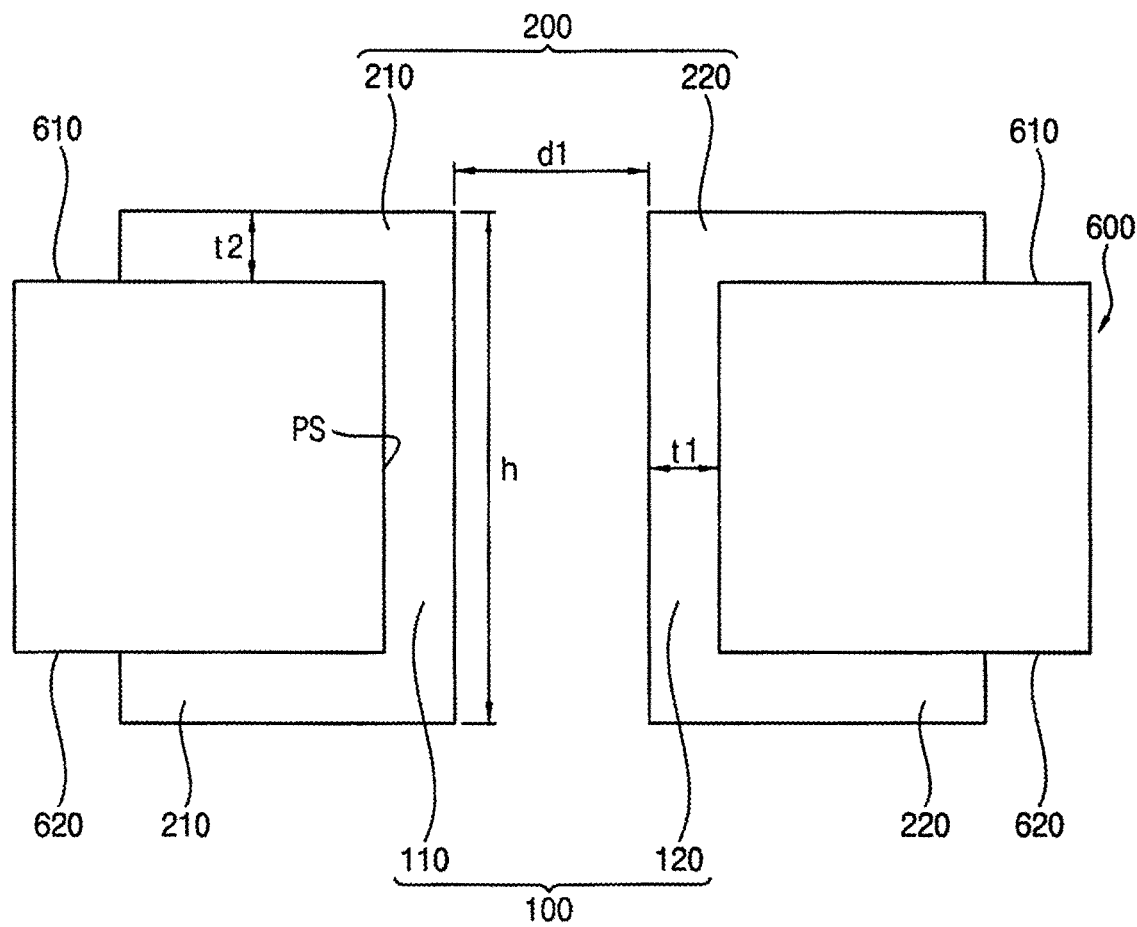
FIG. 6A is a cross-sectional view of the circuit board cut along a line I-I' shown in FIG. 1.

FIG. 5 is a perspective view illustrating a circuit board including a via structure shown in FIG. 1 in accordance with an example embodiment of the present inventive concepts. FIG. 6a is a cross-sectional view of the circuit board cut along a line I-I' shown in FIG. 1 and FIG. 6B is a plan view of the circuit board shown in FIG. 5.

Figure 6B:
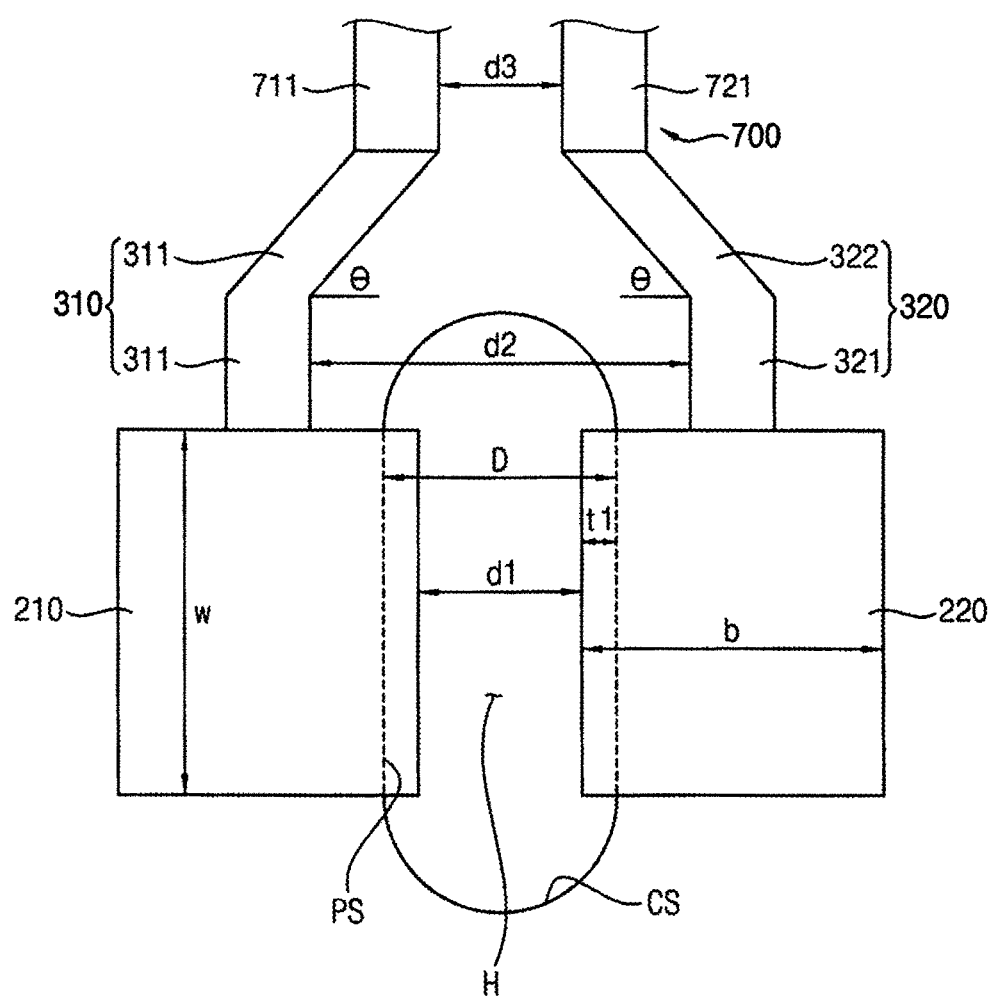
FIG. 6B is a plan view of the circuit board shown in FIG. 5.

Referring to FIGS. 5, 6A and 6B, a circuit board 1000 in accordance with an example embodiment of the present inventive concepts may include a board body 600 having an upper surface 610 and a lower surface 620 and having at least a penetration hole H through the upper surface 610 and the lower surface 620 such that the penetration hole H includes a pair of plane surfaces PS and a pair of curved surfaces CS, a plurality of couple signal lines 700 arranged on the upper surface 610 and the lower surface 620 of the board body 600, respectively such that each of the couple signal lines 700 may have a main signal line 710 transferring a main signal and a reference signal line 720 transferring a reference signal with respect to the main signal, and at least a couple via structure 800 including a plate via 100 penetrating through the penetration hole H and having first and second plates 110 and 120 that may be arranged on the plane surfaces PS, respectively, and face each other distant by a first gap distance d1 in the penetration hole H. The couple signal line 700 on the upper surface 610 may be connected the couple signal line 700 on the lower surface 620 through the board body 600 by the couple via structure 800.

For example, the board body 600 may include an insulation material such as a reinforced glass fiber, an epoxy resin and a photosensitive polymer and a circuit pattern may be arranged on the upper and lower surfaces 610 and 620. The circuit pattern may include a data transfer pattern for electrically communicating with semiconductor chips (not shown) that may be mounted on the circuit board 1000, a driving pattern for transferring a driving power the semiconductor chips and a ground pattern for electrically grounding to an earth.

In the present example embodiment, the circuit board 1000 may include a printed circuit board (PCB) on which the circuit pattern may be arranged and a plurality of mounting areas may be provided in a matrix shape. A contact pad may be arranged on each mounting area and the semiconductor chip may make contact with the contact pad. Various boards may also be used as the circuit board as long as a plurality of semiconductor chips may be mounted on the board and electric signals may be communicated between the semiconductor chips and the electric board by a circuit pattern. For example, the circuit board 1000 may include a silicon-on-insulator (SOI) substrate.

Particularly, the circuit pattern may be arranged into a single layer structure or a multilayer structure on both of the upper and lower surfaces 610 and 620 of the board body 600. The circuit pattern may be arranged into a plurality of conductive lines extending on the upper and lower surfaces 610 and 620 and various signals may be transferred through the conductive line. Particularly, upper conductive lines on the upper surface 610 may be connected to lower conductive lines on the lower surface 620 by via structures penetrating through the board body 600, so the signals may be transferred through the board body 600.

Particularly, some of the conductive lines may be configured as a coupled signal line 700 having a pair of the conductive lines. One of the conductive lines of the coupled signal line may be provide as the main signal line 710 for transferring a main signal and the other conductive line of the coupled signal line may be provided as the reference signal line 720 for transferring a reference signal with respect to the main signal. For example, the reference signal may include a complementary signal having a phase complementary to the phase of the main signal. In addition, the reference signal may also include the driving signal and the ground signal. The coupled signal line 700 may be connected through the board body 600 by the coupled via structure 800 in which a pair of coupled vias may be connected to each of the conductive lines of the coupled signal lines, respectively.

Particularly, when the complementary signal may be transferred as the reference signal, the coupled signal line 700 may function as a differential signal line. Thus, when the main signal and the complementary signal may be simultaneously transferred through the differential signal line, the normal mode noises may be removed in the circuit board 1000 by a destructive interference between the main signal and the complementary signal to thereby improve the signal integrity when transferring the main signals.

The coupled signal line 700 may include an upper coupled signal line UCL arranged on the upper surface 610 of the board body 600 and a lower coupled signal line LCL arranged on the lower surface 620 of the board body 600. The upper coupled signal line UCL and the lower coupled signal line LCL may be connected to each other by the coupled via structure 800.

The upper coupled signal line UCL may include an upper main signal line 711 and an upper reference signal line 721 that may be spaced apart by a third gap distance d3. In the same way, the lower coupled signal line LCL may include a lower main signal line 712 and a lower reference signal line 722 that may be spaced apart by the third gap distance d3. Thus, the coupled signal line 700 may include the main signal line 710 and the reference signal line 720 that may be spaced apart by the third gap distance d3.

The upper and lower coupled signal lines UCL and LCL may be arranged around the penetration hole H and may be connected to the coupled via structure 800 penetrating through the penetration hole H.

Particularly, the upper main signal 711 may be connected to the lower main signal line 712 by the first plate 110 of the coupled via structure 800 and the upper reference signal 721 may be connected to the lower reference signal line 722 by the second plate 120 of the coupled via structure 800, as described in detail hereinafter.

For example, the penetration hole H may extend from the upper surface 610 to the lower surface 620 of the board body 600 and may be shaped into a rounded open rectangle having a pair of plane surfaces PS and a pair of curved surfaces CS. The upper coupled signal lines UCL and the lower coupled signal lines LCL may extend to the penetration hole H.

Thus, the penetration hole H may have a depth corresponding to a vertical distance between the upper and the lower coupled signal lines UCL and LCL, and the plane surface PS and the curved surface CS may have a height h corresponding to the depth of the penetration hole H.

In the present example embodiment, the plane surface PS may be shaped into a square having the height h and a width w and the curved surface CS may be shaped into a semicircle having a diameter D corresponding to a gap distance between the pair of the plane surfaces PS.

The diameter D of the curved surface CS may be greater than the gap distance between the pair of the plane surfaces PS. As described in detail hereinafter, the pair of the curved surface CS may be provide as a portion of a second contact hole, which is denoted as reference mark H2 in FIG. 8E, so the diameter D of the curved surface CS may be greater or smaller than the gap distance between the pair of the plane surfaces PS according to a diameter of the second contact hole H2.

The coupled via structure 800 may include a pair of via structures penetrating through the penetration hole H and connected to the main signal line 710 and the reference signal line 720, respectively.

In the present example embodiment, the coupled via structure 800 may have substantially the same structure as the via structure 500 described in detail with reference to FIGS. 1 to 4B. Thus, the same reference numerals in FIGS. 1 to 4B denote the same elements of the coupled via structure 800.

For example, the coupled via structure 800 may include the plate vias 100 arranged on the plane surfaces PS of the contact hole H and the contact pad 200 and contact line 300 that may be connected to the plate via 100 on the upper and the lower surfaces 610 and 620 of the board body 600.

The plate via 100 may include the first and the second plates 110 and 120 that may be arranged on the pair of the plane surfaces PS and be spaced apart by the first gap distance d1. The first plate 110 may be connected to the main signal line 710 and the second plate 120 may be connected to the reference signal line 720.

In the present example embodiment, the plane surfaces PS may be spaced apart by the diameter D of the curved surfaces CS and the first and the second plates 110 and 120 may have the first thickness t1 on the plane surfaces PS, respectively. Thus, the diameter D of the curved surface CS may be substantially equal to the sum of the first thickness t1 and the first gap distance d1.

For example, the contact pad 200 may be integrally provided with the plate via 100 in one body on the upper and lower surfaces 610 and 620 of the board body 600 and may include the first contact 210 connected to the first plate 110 and the second contact 220 connected to the second plate 120. The contact pad 200 may have the second thickness t2 that may be greater than or equal to the first thickness t1.

The connection line 300 may include the first and the second lines 310 and 320 that may be arranged on the upper and lower surfaces 610 and 620 of the board body 600 and be spaced apart by the second gap distance d2. The first line 310 may be connected to the first contact 210 and the second line 320 may be connected to the second contact 220. The connection line 300 may be integrally provided with the contact pad 200 in one body. Otherwise, the connection line 300 may be individually provided on the upper and lower surfaces 610 and 620 and may be connected to the contact pad 200.

The main signal line 710 may be first line 310 and the reference signal line 720 may be connected to the second line 320. Thus, the upper coupled signal line UCL may be the lower coupled signal line LCL may be connected to each other by the coupled via structure 800 through the penetration hole H.

Particularly, the signal line may be provided as a multilayer structure in a medium of an insulation layer (not shown) on the upper and the lower surfaces 610 and 620 of the insulation body 600. Thus, three or more stacked signal lines that may be vertically stacked on the board body 600 may also be connected with one another by the coupled via structure 800.

In such case, the contact pad 200 and the plate via 100 may have different thicknesses. That is, the second thickness t2 may be different from the first thickness t1.

For example, as described in detail with reference to FIGS. 3A and 3B, when the contact pad 200 may be arranged on an uppermost line and a lowermost line of the board body 600, the underlying uppermost line or lowermost line may also function as an electric pad structure for electrically connecting with the connection line 300. Accordingly, the conductive pad 200 may be expanded as thick as the thickness of the uppermost/lowermost line and a resultant thickness of the conductive pad 200 may be greater than the thickness of the plate via 100.

In such a case, the connection line 300 have the same thickness as the contact pad 200 and may be integrally provided with the contact pad 200 in one body for reducing the shape variation between the contact pad 200 and the connection line 300. In addition, the contact pad 200 and the connection line 300 may have the same thickness and width as the coupled signal line 700, thereby reducing (or, alternatively, minimizing) the shape variations in transferring the main signals and the complementary signals.

Accordingly, the deviation of the characteristic impedance between the coupled signal line 700 and the coupled via structure 800 may be sufficiently reduced (or, alternatively, minimized). Particularly, the impedance variation caused by the thickness difference between the contact pad 200 and the plate via 100 may be controlled by adjusting the contact positions of the connection line 300 and the contact pad 200.

In addition, the contact pad 200 and the plate via 100 may also have the same thickness, as described in detail with reference to FIGS. 4A and 4B. That is, the contact pad 200 may have the same thickness as the plate via 100.

Particularly, the connection line 300 may also have the same thickness as the contact pad 200 for reducing (or, alternatively, minimizing) the shape variation between the contact pad 200 and the connection line 300. In such a case, the plate via 100, the contact pad 200 and the connection line 300 may have the same common thickness. When the thickness of the coupled signal line 700 may be formed to have the same thickness of the contact pad 200 and the connection line 300, the deviation of the characteristic impedance between the differential signal line L and the coupled via structure 500 may be sufficiently reduced (or, alternatively, minimized).

In addition, when the plate via 100, the contact pad 200 and the connection line 300 may have the same thickness and width as the coupled signal line 700, the plate via 100, the contact pad 200, the connection line 300 and the coupled signal line 700 may be arranged in such a way that the first gap distance d1, the second gap distance d2 and the third gap distance d3 may be the same as the coupled gap distance d. That is, the coupled via structure 800 and the coupled signal line 700 may be have the same coupled gap distance d and the shape variation between the differential signal line L and the coupled via structure 500 may be ultimately reduced (or, alternatively, minimized).

Accordingly, the deviation of the characteristic impedance between the coupled via structure 800 and the coupled signal line 700 may be ultimately reduced and the signal may be transferred between the upper differential signal line UL and the lower differential signal line LL without signal distortions.

According to the example embodiments of the circuit board 1000, the characteristic impedance of the coupled via structure 800 may come close to that of the coupled signal line 700 by changing the shape parameters of the plate via 100 such as the via width w, the height h and the first gap distance d1. The shape parameters of the contact pad 200 and the connection line 300, such as such as the length b of the contact pad 200 and the second gap distance d2 of the connection line 300, may be controlled in such a way that the deviation of the characteristic impedance may be reduced (or, alternatively, minimized) between the coupled via structure 800 and the coupled signal line 700. Thus, electric signals may be transferred between the upper and lower coupled signal lines UCL and LCL through the coupled via structure 800 without any significant signal distortions.

The circuit board 1000 may be manufactured by a double penetration process and a plating process, as described in detail hereinafter with reference to FIGS. 7 and 8A to 8F.

Figure 7:
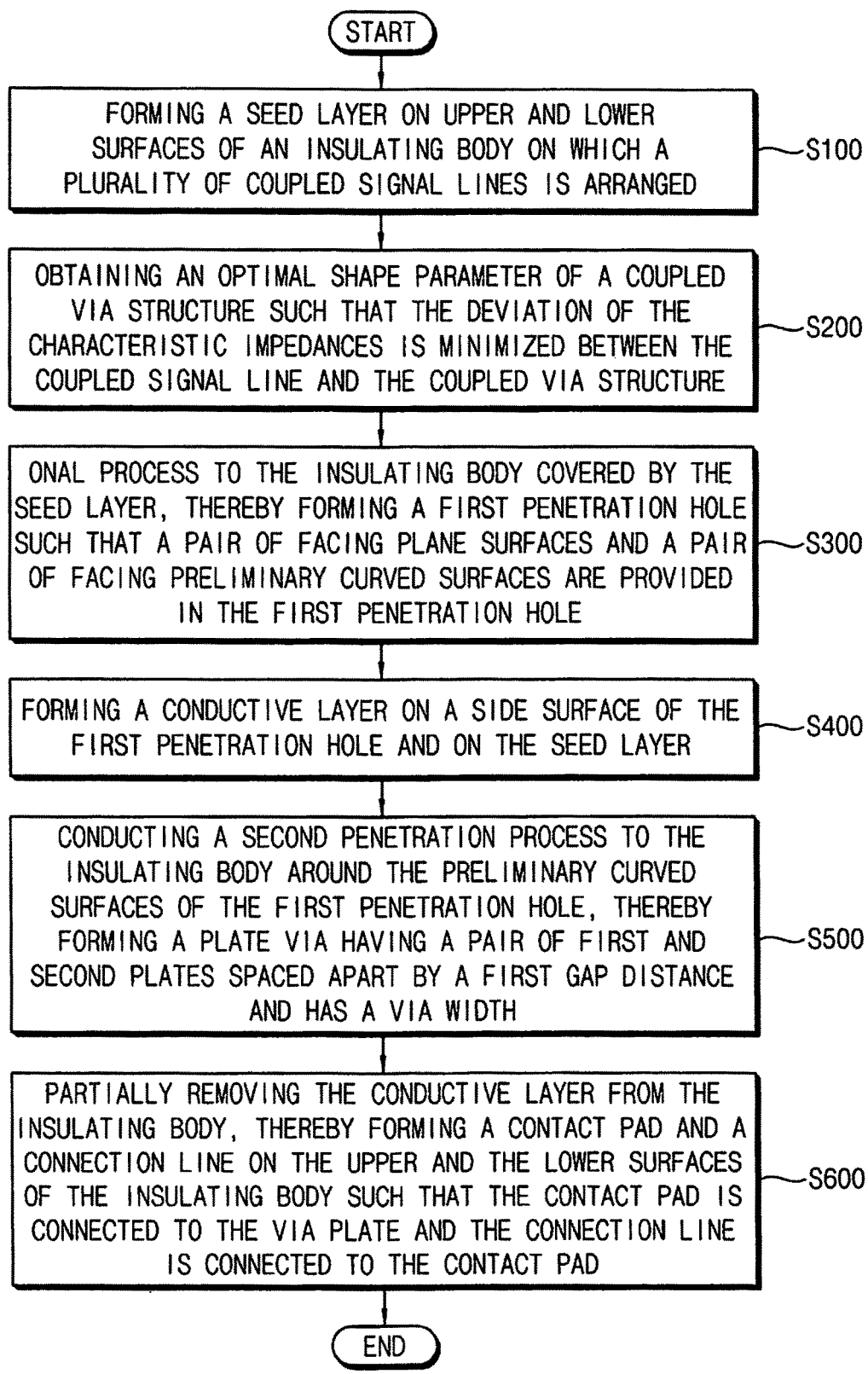
FIG. 7 is a flow chart showing a method of manufacturing the circuit board shown in FIG. 5 in accordance with an example embodiment of the present inventive concepts.

FIG. 7 is a flow chart showing a method of manufacturing the circuit board shown in FIG. 5 in accordance with an example embodiment of the present inventive concepts. FIGS. 8A to 8F are cross sectional views illustrating process steps for the method of manufacturing the circuit board shown in FIG. 5. In FIGS. 8A to 8F, the mark <a> indicates a plan view and the mark <b>indicates a cross sectional view cut along a line A-A' of the corresponding plan view.

Referring to FIGS. 5 and 7, in operation S100, a seed layer 801 may be formed on the upper and lower surfaces 610 and 620 of the board body 600 on which a plurality of coupled signal lines 700 may be arranged. Each of the coupled signal line 700 may have the main signal line 710 and the reference signal line 720.

For example, the board body 600 may include a bulk type insulator BI, at least a conductive circuit pattern C on upper and lower surfaces of the bulk type insulator BI and at least an insulation layer I covering the circuit pattern C. The circuit pattern C and the insulation layer I may be stacked on each of the upper and the lower surfaces of the bulk type insulator BI, so the insulator body 600 may be provided as a multilayer structure having a plurality of layers on each of the upper and lower surfaces thereof.

While the present example embodiment discloses that a single circuit pattern C may be formed on the lower and the upper surfaces of the bulk type insulator BI and a single insulation layer I may be formed on the circuit pattern C, the board body 600 may also include another circuit pattern and another insulation layer that may be sequentially stacked on the insulation layer I. That is, the board body 600 may include a plurality of stacked circuit patterns each of which may be insulated by the interposed insulation layer.

Each of the circuit pattern C may be provided as various wiring lines for transferring various signals.

Particularly, some of the wiring lines may be coupled into a coupled signal line 700 having the main signal line 710 and the reference signal line 720. For example, the reference signal may include a complementary signal having a phase complementary to the phase of the main signal. In addition, the reference signal may also include the driving signal and the ground signal.

The coupled signal line 700 may include a differential signal line for improving signal integrity of the main signal.

Figure 8A:
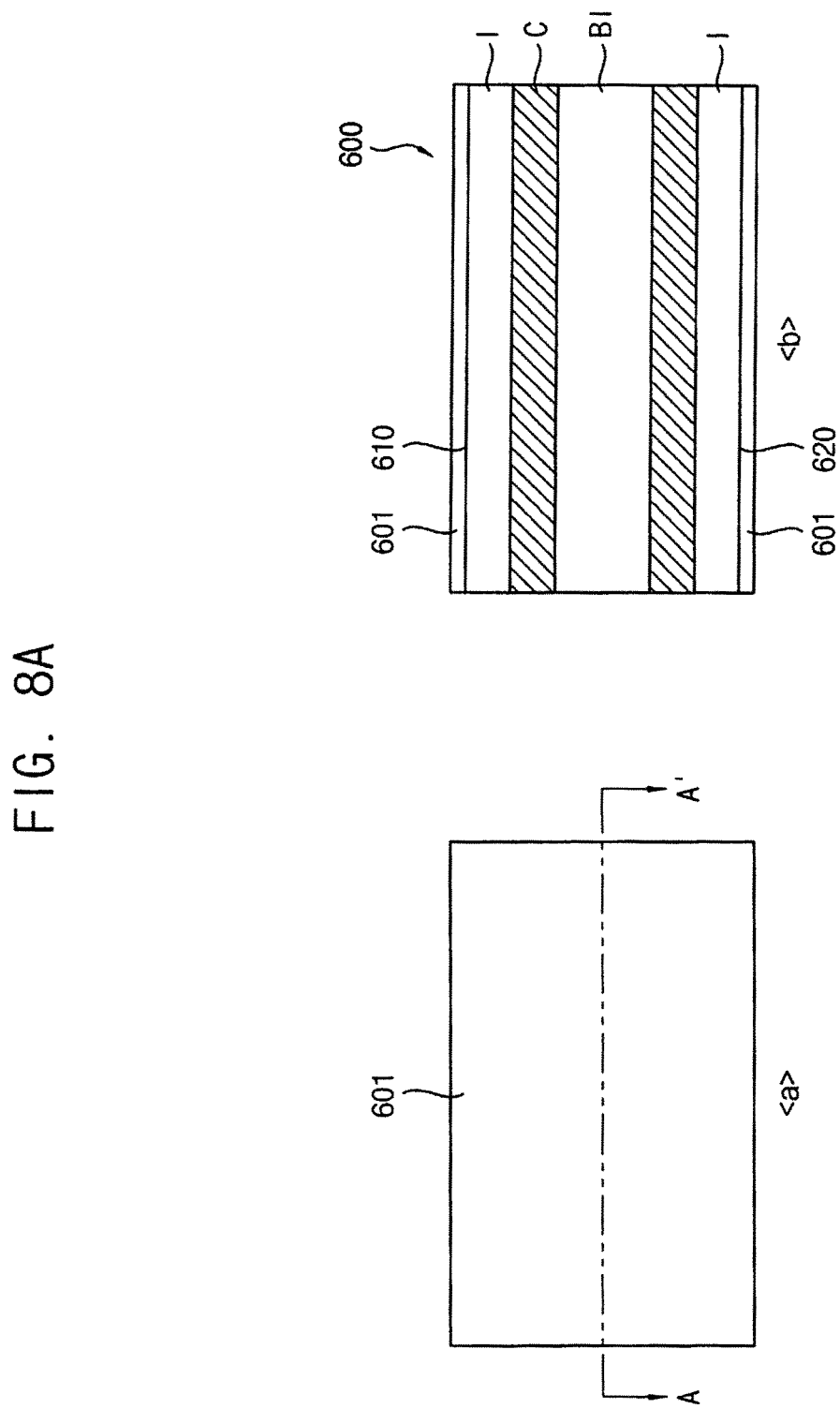

As illustrated in FIG. 8A, the board body 600 having the coupled signal line 700 may be loaded into a via process chamber (not shown) and the seed layer 601 may be formed on a whole surface of the board body 600. For example, a metal layer comprising a low-resistive metal such as copper (Cu) may be formed on the surface of the board body 600 by a deposition process or an epitaxial process as the seed layer 601.

Particularly, the seed layer 601 may be selectively formed on the board body 600. When the conductive circuit pattern C may be covered by the insulation layer I on the bulk type insulator BI, the seed layer 601 may be formed on the insulation layer I for the subsequent formation process for a conductive layer CL in FIG. 8E. Thus, when no insulation layer I may be formed on the circuit pattern C and the circuit pattern C may be provided as an utmost layer of the multilayer structure, the seed layer may not be needed for forming the conductive layer CL. Thus, the seed layer 601 may be selectively formed on the board body 600.

In operation 5200, desired (or, alternatively, optimal) shape parameters of the coupled via structure 800 may be obtained in such a way that the characteristic impedance of the coupled via structure 800 may be approximate to that of the coupled signal line 700.

For example, the via process apparatus (not shown) may include a controller (not shown) as well as the via process chamber and the desired (or, alternatively, optimal) shape parameter of the coupled via structure 800 may be automatically determined in relation with the characteristic impedance of the coupled signal line 700 by the controller.

The controller (not shown) may include processing circuitry and a memory (not shown).

The memory may include at least one of a volatile memory, non-volatile memory, random access memory (RAM), a flash memory, a hard disk drive, and an optical disk drive. The memory may store a stream mapping table 150 and a garbage collection expected cost table 160.

The processing circuitry may be, but not limited to, a processor, Central Processing Unit (CPU), a controller, an arithmetic logic unit (ALU), a digital signal processor, a microcomputer, a field programmable gate array (FPGA), an Application Specific Integrated Circuit (ASIC), a System-on-Chip (SoC), a programmable logic unit, a microprocessor, or any other device capable of performing operations in a defined manner.

The processing circuitry may be configured, through a layout design or execution of computer readable instructions stored in a memory (not shown), as a special purpose computer to determine the desired (or, alternatively, optimal) shape of the coupled via structure 800 by repeatedly changing the shape parameters of the coupled via structure 800 until the deviation of the characteristic impedance between the coupled via structure 800 and the coupled signal line 700 may be within an allowable range. The desired (or, alternatively, optimal) shape of the coupled via structure 800 may be determined by the desired (or, alternatively, optimal) shape parameters.

Various combinations of the shape parameters of the plate via 100, the contact pad 200 and the connection line 300 may be selected and various configurations of the coupled via structure 800 may be obtained corresponding to each of the shape parameters combinations. Then, the configuration of the coupled via structure 800 of which the characteristic impedance may be mostly approximate to that of the coupled signal line 700 may be selected as a desired (or, alternatively, optimal) configuration of the coupled via structure 800. The shape parameters of the desired (or, alternatively, optimal) configuration of the coupled via structure 800 may be specified by the desired (or, alternatively, optimal) shape parameters.

In the present example embodiment, the shape parameters of the plate via 100 may include the via width w, the first thickness t1, the height h and the first gap distance d1 and the shape parameters of the contact pad 200 may include the length b and the second thickness t2. The shape parameters of the connection line 300 may include the third thickness t3 and the second gap distance d2.

In operation 5300, a first penetration process and a translational process may be sequentially conducted to the board body 600, thereby forming a first penetration hole H1 that may be shaped into a rounded rectangle. Thus, a pair of facing plane surfaces PS and a pair of facing preliminary curved surfaces PCS may be provided in the first penetration hole H1.

Figure 8B:
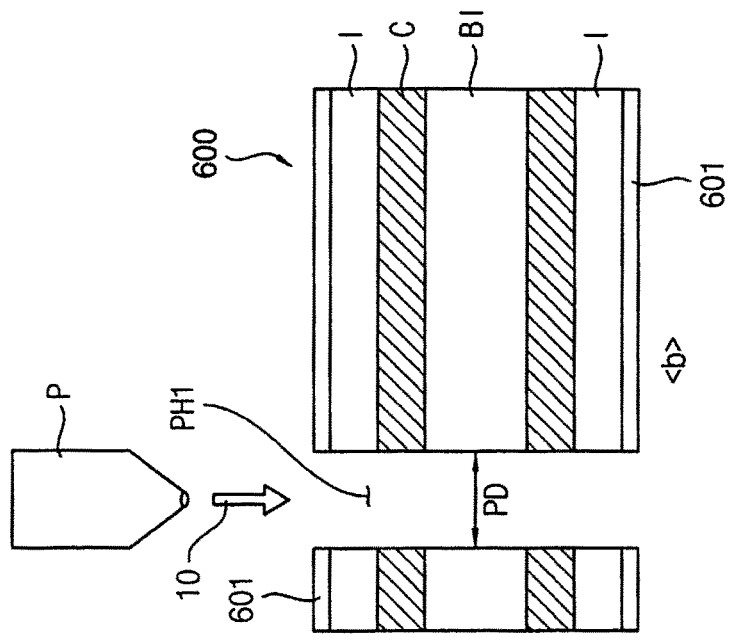
Figure 8B:
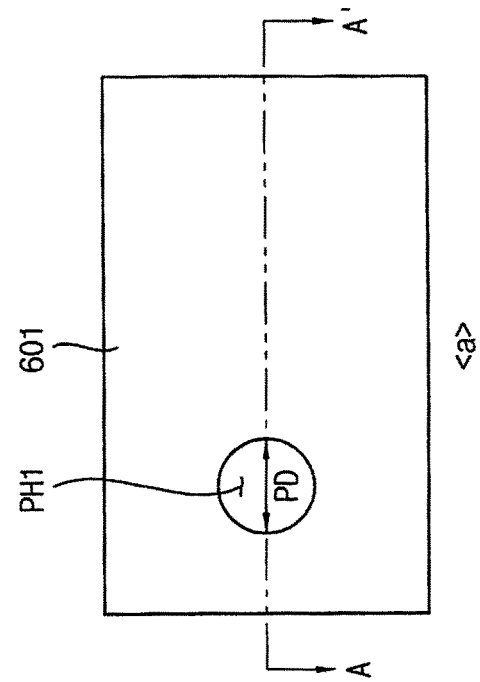

As illustrated in FIG. 8B, a first penetration process 10 may be conducted to the board body 600 by using a penetration tool P such as a laser drilling apparatus and a laser milling apparatus. In the present example embodiment, the laser drilling apparatus may penetrate through the board body 600 from the upper surface 610 to the lower surface 620, thereby forming a first preliminary penetration hole PH1 through the board body 600.

Figure 8C:
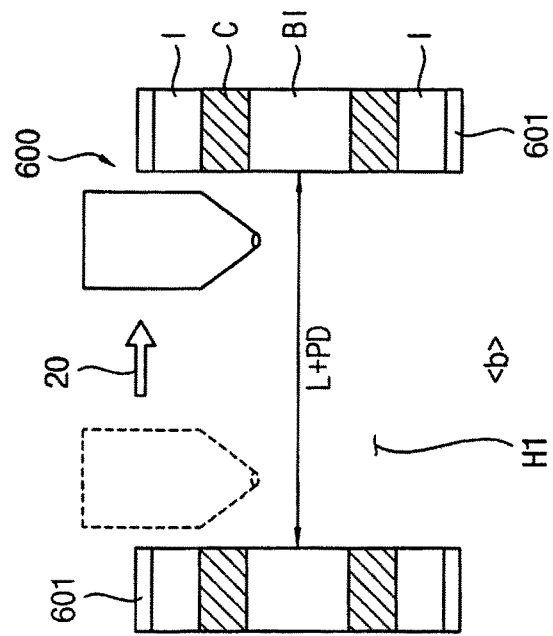
Figure 8C:
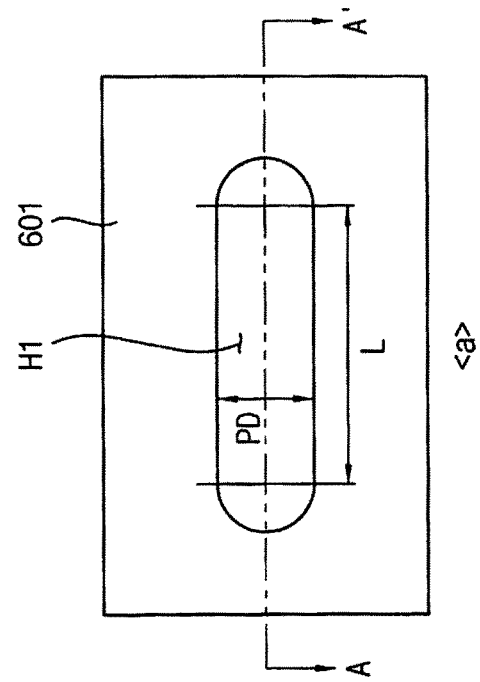

Then, as illustrated in FIG. 8C, a translational process 20 may be conducted to the board body 600 in such a way that the penetration tool P penetrating through the board body 600 may linearly move in a desired (or, alternatively, predetermined) translational direction, thereby forming the first penetration hole H1 that may be shaped into the rounded rectangle.

When the penetration tool P may move linearly in the translational direction, a second preliminary penetration hole PH2 may be formed opposite to the first preliminary penetration hole PH1 and a rectangular hole may be formed between the first and the second preliminary penetration holes PH1 and PH2 along the translational direction. Accordingly, a pair of the first and the second preliminary penetration holes PH1 and PH2 and the rectangular hole may be formed into the first penetration hole H1.

Thus, a pair of preliminary curved surfaces PCS of the first and the second preliminary penetration holes PH1 and PH2 may be arranged at end portions of the first penetration hole H1 with facing each other in the translational direction and a pair of the plane surfaces PS of the rectangular hole may be arranged between the pair of the preliminary curved surfaces PCS in the first penetration hole H1. The pair of the plane surfaces PS may face each other in a direction perpendicular to the translational direction.

In the present example embodiment, a pair of the plane surfaces PS may be spaced apart by a gap distance corresponding to a diameter PD of the first and the second preliminary penetration holes PH1 and PH2. Thus, the pair of the preliminary curved surfaces PCS may be spaced apart in the translational direction by a total distance of the translational length L of the translational process 20 and the diameter PD of the first and the second preliminary penetration holes PH1 and PH2.

In operation 5400, the conductive layer CL may be formed on the board body 600 by using the seed layer 601 in such a way that the plane surfaces PS and the preliminary curved surfaces PCS of the first penetration hole H1 may be covered by the conductive layer CL.

Figure 8D:
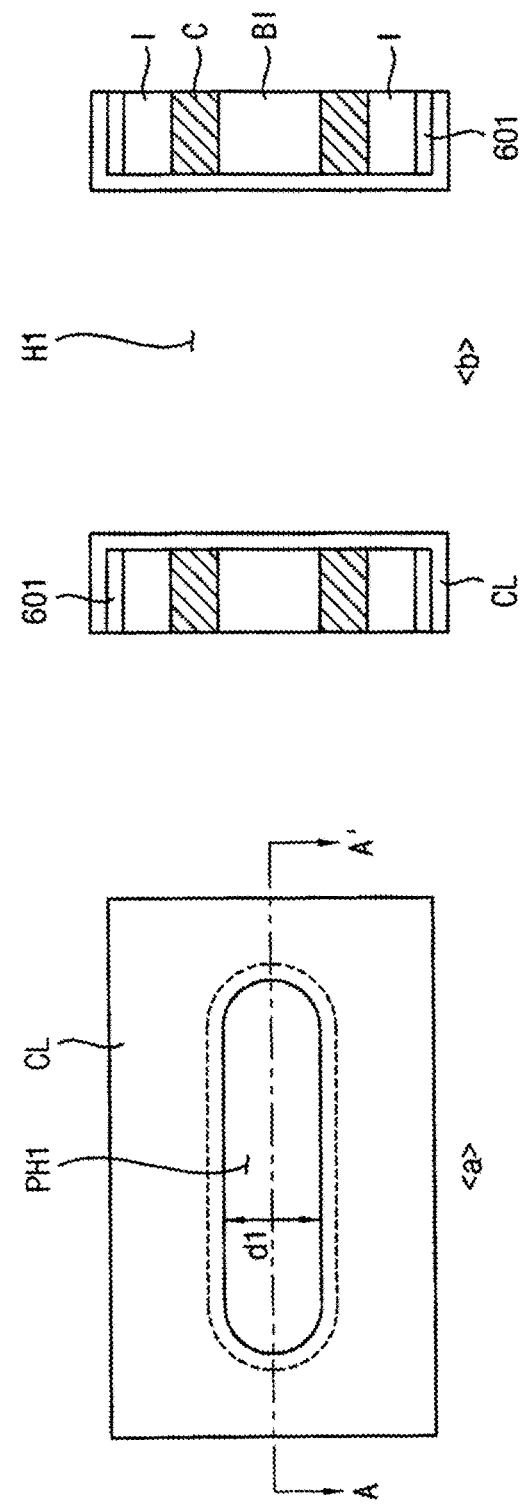

As illustrated in FIG. 8D, a low-resistive metal may be plated on the whole surfaces of the board body 600 by a plating process using the seed layer 601 as a plating seed. Thus, the conductive layer CL may be formed on the upper and lower surfaces 610 and 620 as well as on the plane surfaces PS and the preliminary curved surfaces PCS of the penetration hole H1. For example, the low-resistive metal may include copper (Cu).

Particularly, the conductive layer CL may be formed to a first thickness t1 in such a way that the conductive layer CL on the pair of the plane surfaces PS may be spaced apart by the first gap distance d1.

Since the gap distance of the pair of the plane surface PS may correspond to the diameter PD of the first and the second preliminary penetration holes PH1 and PH2, the first gap distance d1 of the conductive layer CL may be determined by the diameter PD of the first and the second preliminary penetration holes PH1 and PH2 and the first thickness t1.

Therefore, the controller of the via process apparatus may determine the diameter PD of the first and the second preliminary penetration holes PH1 and PH2 and the first thickness t1 in such a way that the conductive layer CL on the plane surfaces PS may be spaced apart by a desired (or, alternatively, optimal) first gap distance d1 that is already obtained by the controller as the desired (or, alternatively, optimal) shape parameter of the plate via 100.

In operation 5500, as illustrated in FIG. 8E, a second penetration process 30 may be conducted to the board body 600 covered by the conductive layer CL around the first and the second preliminary contact holes PH1 and PH2, thereby forming a pair of second penetration holes H2 at both end portions of the first penetration hole H1. Thus, the second penetration holes H2 may have the diameter D greater than the first gap distance d1 and be spaced apart from each other by an inter-center distance CD. As a result, the conductive layer on the plane surfaces PS may be formed into first and second plates 110 and 120 having the via width w smaller than the inter-center distance CD and spaced apart by the first gap distance d1. The first and the second plates 110 and 120 may extend downwards through the board body 600 as the plate via 100 for electrically connecting the coupled signal lines 700 through the board body 600.

For example, the second penetration process 30 may be conducted to the board body 600 covered by the conductive layer CL by using a pair of the penetration tools P that may be spaced apart by the inter-center distance CD. Thus, a pair of the second penetration holes H2 may be formed at both end portions of the rectangular-shaped first penetration hole H1 in such a way that the second penetration hole H2 may have the diameter D greater than the first gap distance d1. The first and the second preliminary penetration holes PH1 and PH2 may be replaced with the pair of the second penetration holes H2, thereby forming the penetration hole H having the pair of the second penetration holes H2 and the rectangular hole. Accordingly, the penetration hole H may include a pair of the curved surfaces CS corresponding to surface portions of the second penetration holes H2 and a pair of the plane surfaces PS corresponding to the facing surfaces of the rectangular hole and having the void width w smaller than the inter-center distance CD of the second penetration holes H2.

Particularly, the second penetration holes H2 may have diameters D greater than the diameters PD of the first and the second preliminary contact holes PH1 and PH2, so that the conductive layer CL may be removed from the preliminary curved surfaces PCS of the first and the second preliminary contact holes PH1 and PH2.

In addition, the conductive layer CL on the plane surfaces PS of the rectangular hole of the first penetration hole H1 may also be removed from edge portions of the plane surfaces PS in the second penetration process, so the conductive layer CL on the plane surfaces PS of the rectangular hole of the first penetration hole H1 may be formed into the first and the second plates 110 and 120 having a boundary curve surface 100p of which the curvature may be the same as the curved surface PS of the second penetration hole H2. That is, the plate via 100 having the first and the second plates 110 and 120 may be formed in the penetration hole H by the second penetration process.

Due to the edge removal of the conductive layer CL from the plane surfaces PS in the second penetration process, the via width w of the first and the second plates 110 and 120 may become smaller than the inter-center distance CD of the pair of the second penetration holes H2. That is, the via width of the plate via 100 may be varied by the diameter D and the inter-center distance CD of the pair of the second penetration holes H2.

Accordingly, the first and the second plates 110 and 120 may be spaced apart by the first gap distance d1 and may have the via width smaller than the inter-center distance CD and the height h corresponding to the depth of the penetration hole H or to a thickness of the board body 600.

The first gap distance d1 may be determined by the diameter PD of the first and the second preliminary penetration holes PH1 and PH2 and the via width w may be determined by the first thickness t1 and the inter-center distance CD between the pair of the second penetration holes H2.

Once the first gap distance d1 and the via width w may be obtained as the desired (or, alternatively, optimal) shape parameters of the plate via 100, the controller of the via process apparatus may determine the diameter PD of the first and the second preliminary penetration holes PH1 and PH2 and the diameter D and the inter-center distance CD of the pair of the second penetration holes H2 for forming the plate via 100 having the desired (or, alternatively, optimal) first gap distance d1 and the desired (or, alternatively, optimal) via width w. Thereafter, the first and the second penetration processes 10 and 30 may be conducted based on the diameter PD of the first and the second preliminary penetration holes PH1 and PH2 and the diameter D and the inter-center distance CD of the pair of the second penetration holes H2.

Figure 8F:
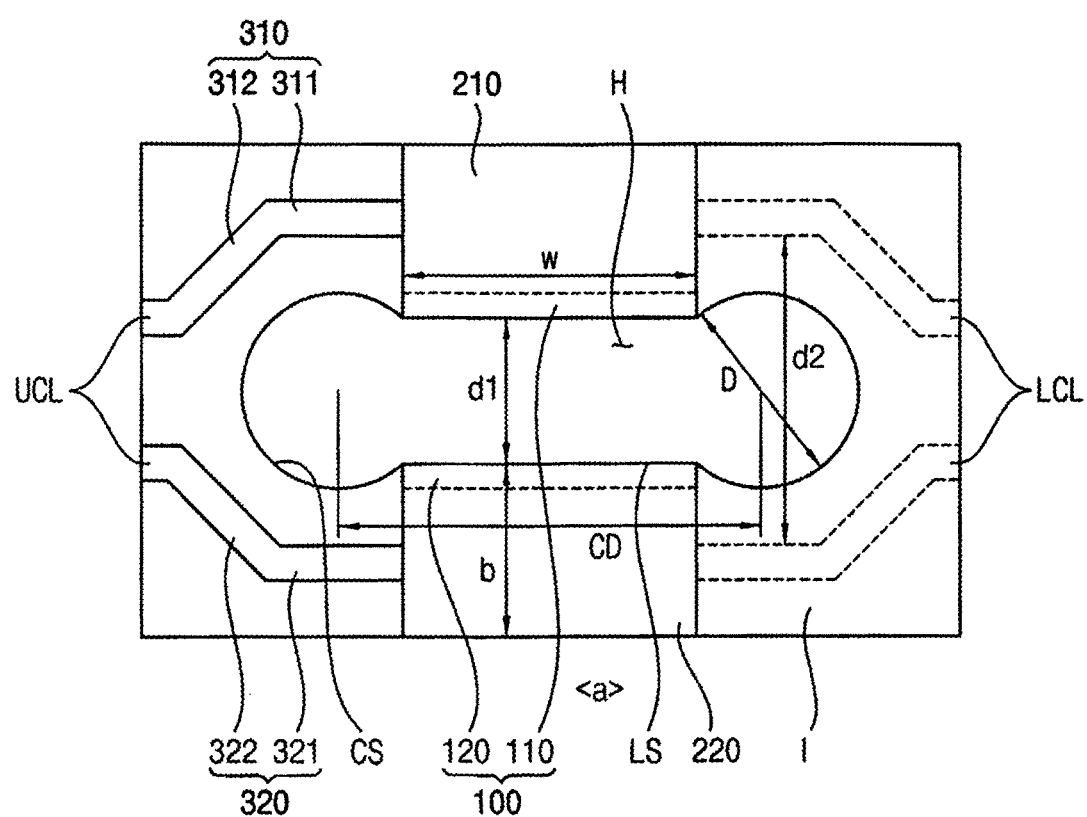

In operation 5600, as illustrated in FIG. 8F, the conductive layer CL may be partially removed from the upper and the lower surfaces 610 and 620 of the board body 600, thereby forming the contact pad 200 and the connection line 300 on the upper and the lower surfaces 610 and 620 of the board body 600 in such way that the contact pad 200 may be connected to the plate via 100 and the connection line 300 may be connected to the contact pad 200. In the present example embodiment, the contact pad 200 may include the first contact 210 that may be connected to the first plate 110 and the second contact 220 that may be connected to the second plate 120.

The conductive layer CL may be patterned into the contact pad 200 and the connection line 300 at the upper and the lower surfaces 610 and 620 of the board body 600, respectively.

At first, the conductive layer CL may be patterned into the first contact 210 and the second contact 220 having the length b and the via width w. In the present example embodiment, the conductive layer CL may be integrally formed on the upper and the lower surfaces 610 and 620 and on the plane surfaces PS of the penetration hole H, the first contact 210 may be integrally provided with the first plate 110 in one body and the second contact 220 may be integrally provided with the second plate 210 in one body.

The second thickness t2 of the contact pad 200 may be greater than or equal to the first thickness of the plate via 100. When the conductive layer CL may be formed on the seed layer 601, the seed layer 601 underlying the conductive layer CL may also be patterned together with the conductive layer CL as a seed pattern 601a. In such a case, the seed pattern 601a underlying the contact pad 200 may also function as the contact pad 200. Thus, the thickness of the contact pad 200 may substantially increase as thick as the thickness of the seed pattern 601a. Otherwise, when no seed layer may be needed for forming the conductive layer CL on the board body 600, the contact pad 200 and the plate via 100 may have substantially the same thickness.

Further, when the circuit pattern C itself may be used as the seed layer, the conductive layer CL may be formed on the circuit pattern C. In such a case, the circuit pattern C underlying the conductive layer CL may also be patterned together with the conductive layer CL as an underlying pad pattern (not shown). The pad pattern underlying the contact pad 200 may also function as the contact pad 200, and the thickness of the contact pad 200 may substantially increase as thick as the thickness of the circuit pattern C.

Accordingly, the contact pad 200 may be formed into a rectangular pad having the length b and the via width w. The thickness of the contact pad 200 may be varied according to an underlying structure of the contact pad 200.

Thereafter, the patterning process may still be conducted to the conductive layer CL, thereby forming the connection line 300 extending from the contact pad 200. Similar to the contact pad 200, the connection line 300 may include the first line 310 that may be connected with the first contact 210 and the main signal line 710 and the second line 320 that may be connected with the second contact 220 and the reference signal line 720. Particularly, the first line 310 may include a pad line 311 that may be linearly connected to the first contact 210 and the deformable line 312 that may be flexibly connected to the main signal line 710. In the same way, the second line 320 may include a pad line 321 that may be linearly connected to the second contact 220 and the deformable line 322 that may be flexibly connected to the reference signal line 720.

The contact positions of each pad lines 311 and 321 with the first and the second contact 210 and 220 may be automatically determined by the controller in such a way that the deviations of the characteristic impedance between the coupled via structure 800 and the coupled signal line 700 may be reduced (or, alternatively, minimized). For example, the second gap distance d2 may be determined for reducing (or, alternatively, minimizing) the deviations of the characteristic impedance between the coupled via structure 800 and the coupled signal line 700, and the process conditions of the patterning process for forming the connection line 300 may be controlled in such a way that the first and the second lines 310 and 320 may become spaced apart by the second gap distance d2.

Accordingly, the couple via structure 800 having the plate via 100, the contact pad 200 and the connection line 300 that may be shaped according to the desired (or, alternatively, optimal) shape parameters may be provided with the board body 600 and the upper coupled signal line UCL may be connected to the lower coupled signal line LCL through the board body 600 by the couple via structure 800 with reduced (or, alternatively, minimized) deviation of the characteristic impedances between the couple via structure 800 and the coupled signal line 700.

Particularly, the connection line 300 and the plate via 100 may be formed in such a configuration that the first gap distance d1 and the second gap distance d2 may be the same as the third gap distance d3, so the coupled via structure 800 may be connected with the coupled signal line 700 without the gap distance changes. Thus, the upper coupled signal line UCL and the lower coupled signal line LCL may be connected with each other by the coupled via structure 800 with mostly reduced (or, alternatively, minimized) deviations of the characteristic impedances between coupled signal line 700 and the coupled via structure 800.

According to the example embodiments of the circuit board and the method of manufacturing the same, the coupled via structure 800 may be configured as flat plate combinations of the plate via 100, the contact pad 200 and the connection line 300, thereby facilitating variations of the shapes and the gap distances of coupled via structure 800. Thus, the parameters of the characteristic impedance of the coupled via structure 800 may be simplified and the variation ranges of the characteristic impedance of the coupled via structure 800 may sufficiently increase in the circuit board 1000. Thus, the characteristic impedance of the coupled via structure 800 may become much more approximate to the characteristic impedance of the coupled signal line 700 just by changing the shape parameters of the coupled via structure 800, thereby reducing (or, alternatively, minimizing) the deviation of the characteristic impedance between the coupled via structure 800 and the coupled signal line 700.

The circuit board 1000 may be used as a package board for mounting semiconductor chips, a module board for mounting a plurality of operation modules having semiconductor chips and analogue devices and a mother board for electronic devices. Particularly, the circuit board 1000 may be widely used as a high speed memory module board, a main board on which a central process unit (CPU) may be mounted and a high-operated system board such as a network board for reducing (or, alternatively, minimizing) the signal distortion caused by the deviation of the characteristic impedance between the coupled via structure 800 and the coupled signal line 700.

According to the example embodiments of the present inventive concept, the characteristic impedance of the coupled via structure may become close to that of the coupled signal line just by changing the shape parameters of the plate via, the contact pad and the connection line.

Particularly, the via width, the height and the first gap distance of the plate via, the length and the second gap distance of the contact pad may be changed for reducing (or, alternatively, minimizing) the deviation of the characteristic impedance between the coupled via structure and the coupled signal line. The changes of the shape parameters of the coupled via structure may be automatically repeated until the deviation of the characteristic impedance between the coupled via structure and the coupled signal line may be within an allowable range. Therefore, the signal may be transferred between the upper signal line and the lower signal line via the coupled via structure without significant signal distortions.

Particularly, the coupled via structure may be configured as flat plate combinations of the plate via, the contact pad and the connection line, thereby facilitating variations of the shapes and the gap distances of coupled via structure. Thus, the parameters of the characteristic impedance of the coupled via structure may be simplified and the variation ranges of the characteristic impedance of the coupled via structure may sufficiently increase in the circuit board. Thus, the coupled via structure for reducing (or, alternatively, minimizing) the deviation of the characteristic impedance with respect to the coupled signal line may be easily formed in the circuit board.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A coupled via structure comprising:
   a plate via penetrating through a board body, the plate via including a first plate and a second plate, the first plate and the second plate facing each other with a first gap distance therebetween;
   a contact pad connected to the plate via on a surface of the board body, the contact pad including a first contact connected to the first plate and a second contact connected to the second plate, the first contact and the second contact being separated from each other; and
   a connection line connected to the contact pad on the surface of the board body, the connection line including a first line and a second line, the first line connected to the first contact and the second line connected to the second contact, the second line being spaced apart from the first line by a second gap distance such that the connection line is connected to a coupled signal line having a main signal line for transferring a main signal and a complementary signal line for transferring a complementary signal with respect to the main signal, wherein the contact pad has a width and a thickness such that the width of the contact pad is equal to a width of the plate via and the thickness of the contact pad is greater than a thickness of the plate via.

2. The coupled via structure of claim 1, wherein the connection line is integral with the contact pad in one body such that a thickness of the connection line equals the thickness of the contact pad.

3. The coupled via structure of claim 2, wherein
   the first line is connected to the main signal line and has a same width and thickness as the main signal line, and
   the second line is connected to the complementary signal line and has a same width and thickness as the complementary signal line.

4. The coupled via structure of claim 3, wherein the plate via, the contact pad and the connection line have a same width such that the first contact has a same width as the main signal line and the second contact has a same width as the complementary signal line.

5. The coupled via structure of claim 1, wherein the main signal line and the complementary signal line are spaced from each other by the first gap distance in parallel with each other.

6. The coupled via structure of claim 5, wherein the first gap distance is equal to the second gap distance.

7. A circuit board comprising:
   a board body having an upper surface and a lower surface;
   a plurality of coupled signal lines arranged on the upper surface and the lower surface of the board body, respectively, each of the plurality of coupled signal lines including a main signal line and a reference signal line, the main signal line configured to transfer a main signal and the reference signal line configured to transfer a reference signal with respect to the main signal; and
   at least a coupled via structure including,
      a plate via penetrating through a penetration hole between the upper surface and lower surface, the plate via including a first plate and a second plate on a pair of plane surfaces in the penetration hole such that the first plate and the second plate face each other in the penetration hole with a first gap distance therebetween, at least one of the plurality of coupled signal lines on the upper surface being connected to at least one of the plurality of coupled signal lines on the lower surface through the board body by the coupled via structure, and
      at least a pair of upper contact pads and lower contact pads connected to the first plate and the second plate on the upper surface and the lower surface of the board body, respectively, such that each of the pair of upper contact pads and the lower contact pads includes a first contact connected to the first plate and a second contact connected to the second plate, the first contact and the second contact being separated from each other on the upper surface and the lower surface, respectively,
   wherein the pair of upper contact pads and lower contact pads each have a width and a thickness such that the width of each of the pair of upper contact pads and lower contact pads equals a width of the plate via and the thickness of each of the pair of upper contact pads and lower contact pads is greater than a thickness of the plate via.

8. The circuit board of claim 7, wherein the coupled via structure includes at least a pair of upper connection lines and lower connection lines connected to the pair of upper contact pads and lower contact pads on the upper surface and the lower surface of the board body, respectively, such that each of the pair of upper connection lines and lower connection lines include a first line connected to the first contact and a second line connected to the second contact, the second line being spaced apart from the first line by a second gap distance.

9. The circuit board of claim 8, wherein the pair of upper connection lines and lower connection lines are integral with the pair of upper contact pads and lower contact pads in one body, respectively, such that a thickness of each of the pair of upper connection lines and lower connection lines is same as the thickness of the pair of upper contact pads and lower contact pads, respectively.

10. The circuit board of claim 9, wherein the pair of upper connection lines and lower connection lines are connected to respective ones of the plurality of the coupled signal lines, and the pair of upper connection lines and lower connection lines have a same width and thickness as respective ones of the plurality of coupled signal lines such that the first contact has a same width as the main signal line and the second contact has a same width as the reference signal line.

11. The circuit board of claim 8, wherein the pair of upper connection lines and lower connection lines are connected to respective ones of the plurality of the coupled signal lines, and the pair of upper connection lines and lower connection lines have a same width and thickness as respective ones of the plurality of coupled signal lines such that such that the one of the plurality of coupled signal lines, the pair of upper connection lines and lower connection lines, the pair of upper contact pads and lower contact pads and the plate via have a same width and a same thickness.

12. The circuit board of claim 8, wherein the main signal line is spaced apart from the reference signal line by the first gap distance, the first gap distance being same as the second gap distance such that one of the plurality of coupled signal lines, one of the pair of upper connection lines and lower connection lines and the plate via are arranged in a line together with a same gap distance.

13. The circuit board of claim 8, wherein
the pair of plane surfaces are rectangle surfaces having a height corresponding to a depth of the penetration hole and a width corresponding to a width of the pair of upper contact pads and lower contact pads, and
a pair of curved surfaces are semicircular surfaces in the penetration hole having a diameter greater than a gap distance between the pair of plane surfaces.

14. The circuit board of claim 8, wherein the reference signal includes one of a complementary signal with respect to the main signal, a driving signal for driving a semiconductor device that is connected to the plurality of coupled signal lines and a ground signal for the semiconductor device.

15. The circuit board of claim 7, wherein the first contact is connected to the first plate and a first line and the second contact is connected to the second plate and a second line spaced apart from the first line.

16. A circuit board comprising:
an insulating body having at least a penetration hole between an upper surface and a lower surface defined by a pair of vertical plane surfaces and a pair of vertical curved surfaces;
a plurality of differential signal lines arranged on the upper surface and the lower surface of the insulating body, respectively, the plurality of differential signal lines including a main signal line transferring a main signal and a complementary signal line transferring a complementary signal complementary to the main signal; and
at least a differential via structure penetrating through the insulating body and connecting the plurality of differential signal lines between the upper surface and the lower surface,
wherein the differential via structure includes:
a pair of a first plate via and a second plate via vertically arranged on the pair of vertical plane surfaces and facing each other in the penetration hole;
a pair of upper contact pads and lower contact pads connected to the first plate and the second plate on the upper surface and the lower surface, respectively, such that the pair of upper contact pads and lower contact pads include a first contact connected to the first plate via and a second contact connected to the second plate via; and
a pair of upper connection lines and lower connection lines connected to the pair of upper contact pads and lower contact pads on the upper surface and the lower surface, respectively, such that the pair of upper connection lines and lower connection lines include a first line that is connected to the first contact and the main signal line and a second line that is connected to the second contact and the complementary signal line; and
wherein the first contact has a same width as the first plate via and a thickness greater than a thickness of the first plate via, and the second contact has a same width as the second plate via and a thickness greater than a thickness of the second plate via.

17. The circuit board of claim 16, wherein the first contact has a same width and a same thickness as those of the first line and the second contact has a same width and a same thickness as those of the second line.

18. The circuit board of claim 17, wherein the signal line has a same width and a same thickness as the first line and the plurality of differential signal lines have a same width and a same thickness as those of the second line.

19. The circuit board of claim 16, wherein
the pair of vertical plane surfaces are shaped into vertical rectangle surfaces having a height corresponding to a depth of the penetration hole and a width corresponding to a width of the first contact and the second contact, and
the pair of vertical curved surfaces are shaped into a semicircular surface having a diameter greater than a gap distance between the pair of vertical plane surfaces.

20. The circuit board of claim 16, wherein the first plate via and the second plate via are spaced apart from each other by a first gap distance, the first line and the second line are spaced apart from each other by a second gap distance greater than or equal to the first gap distance, and the main signal line and the complementary signal line are spaced apart from each other by a third gap distance smaller than or equal to the second gap distance.

* * * * *